US006762092B2

United States Patent
Yuan et al.

(10) Patent No.: US 6,762,092 B2
(45) Date of Patent: Jul. 13, 2004

(54) SCALABLE SELF-ALIGNED DUAL FLOATING GATE MEMORY CELL ARRAY AND METHODS OF FORMING THE ARRAY

(75) Inventors: Jack H. Yuan, Cupertino, CA (US); Eliyahou Harari, Los Gatos, CA (US); Yupin K. Fong, Fremont, CA (US); George Samachisa, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/925,102

(22) Filed: Aug. 8, 2001

(65) Prior Publication Data

US 2004/0095797 A1 May 20, 2004

(51) Int. Cl.[7] .............................................. H01L 21/336
(52) U.S. Cl. ...................................... 438/257; 438/593
(58) Field of Search .............................. 438/257, 261, 438/262, 264, 265, 593, 594

(56) References Cited

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,297,148 A | 3/1994 | Harari et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,661,053 A | 8/1997 | Yuan | |
| 5,712,180 A | 1/1998 | Guterman et al. | |
| 5,963,889 A | 10/1999 | Yamauchi | |
| 6,048,768 A | 4/2000 | Ding et al. | |
| 6,103,573 A | 8/2000 | Harari et al. | |
| 6,151,248 A | * 11/2000 | Harari et al. | |
| 6,222,762 B1 | 4/2001 | Guterman et al. | |
| 6,281,075 B1 | 8/2001 | Yuan et al. | 438/257 |
| 6,406,961 B1 | * 6/2002 | Chen | |
| 6,509,222 B1 | 1/2003 | Grossi | |
| 6,518,618 B1 | 2/2003 | Fazio | |

FOREIGN PATENT DOCUMENTS

| | | |
|---|---|---|
| EP | 0 780 902 A1 | 6/1997 |
| EP | 1 104 023 A1 | 5/2001 |
| WO | 01/41199 | 6/2001 |

OTHER PUBLICATIONS

Aritome, Seiichi, "Advanced Flash Memory Technology and Trends for File Storage Application," IEDM Technical Digest, International Electronic Devices Meeting, IEEE, San Francisco, California, Dec. 10–13, 2000, pp 33.1.1–33.1.4.

(List continued on next page.)

*Primary Examiner*—Phuc T. Dang
(74) *Attorney, Agent, or Firm*—Parsons Hsue & de Runtz LLP

(57) ABSTRACT

An integrated non-volatile memory circuit is formed by first growing a thin dielectric layer on a semiconductor substrate surface, followed by depositing a layer of conductive material such as doped polysilicon on this dielectric layer, the conductive material then being separated into rows and columns of individual floating gates. Cell source and drain diffusions in the substrate are continuously elongated across the rows. Field dielectric deposited between the rows of floating gates provides electrical isolation between the rows. Shallow trenches may be included between rows without interrupting the conductivity of the diffusions along their lengths. A deep dielectric filled trench is formed in the substrate between the array and peripheral circuits as electrical isolation. Various techniques are included that increase the field coupling area between the floating gates and a control gate. Other techniques increase the thickness of dielectric between control gates in order to decrease the field coupling between them.

20 Claims, 12 Drawing Sheets

OTHER PUBLICATIONS

Takeuchi, Y., et al., "A Self–Aligned STI Process Integration for Low Cost and Highly Reliable 1Gbit Flash Memories," 1998 Symposium on VLSI Technology; Digest of Technical Papers, IEEE, Honolulu, Hawaii, Jun. 9–11, 1998, pp. 102–103.

Lee, Jae–Duk, et al., "Effects of Parasitic Capacitance on NAND Flash Memory Cell Operation," Non–Volatile Semiconductor Memory Workshop, IEEE, Monterey, California, Aug. 12–16, 2001, pp. 90–92.

Chan, et al., "A True Single–Transistor Oxide–Nitride–Oxide EEPROM Device," *IEEE Electron Device Letters*, vol. EDL–8, No. 3, Mar. 1987, pp. 93–95.

Nozaki et al., "A 1–Mb EEPROM with MONOS Memory Cell for Semiconductor Disk Application," *IEEE Journal of Solid State Circuits*, vol. 26, No. 4, Apr. 1991, pp. 497–501.

Eitan et al., "NROM: A Novel Localized Trapping, 2–Bit Nonvolatile Memory Cell," *IEEE Electron Device Letters*, vol. 21, No. 11, Nov. 2000, pp. 543–545.

DiMaria et al., "Electrically–alterable read–only–memory using Si–rich $SIO_2$ injectors and a floating polycrystalline silicon storage layer," *J. Appl. Phys.* 52(7), Jul. 1981, pp. 4825–4842.

Hori et al., "A MOSEFT with Si–implanted Gate–$SiO_2$ Insulator for Nonvolatile Memory Applications," IEDM 92, Apr. 1992, pp. 469–472.

Document Number 02/25025, Dated Jul. 8, 2002, Intl. Search Report.

\* cited by examiner

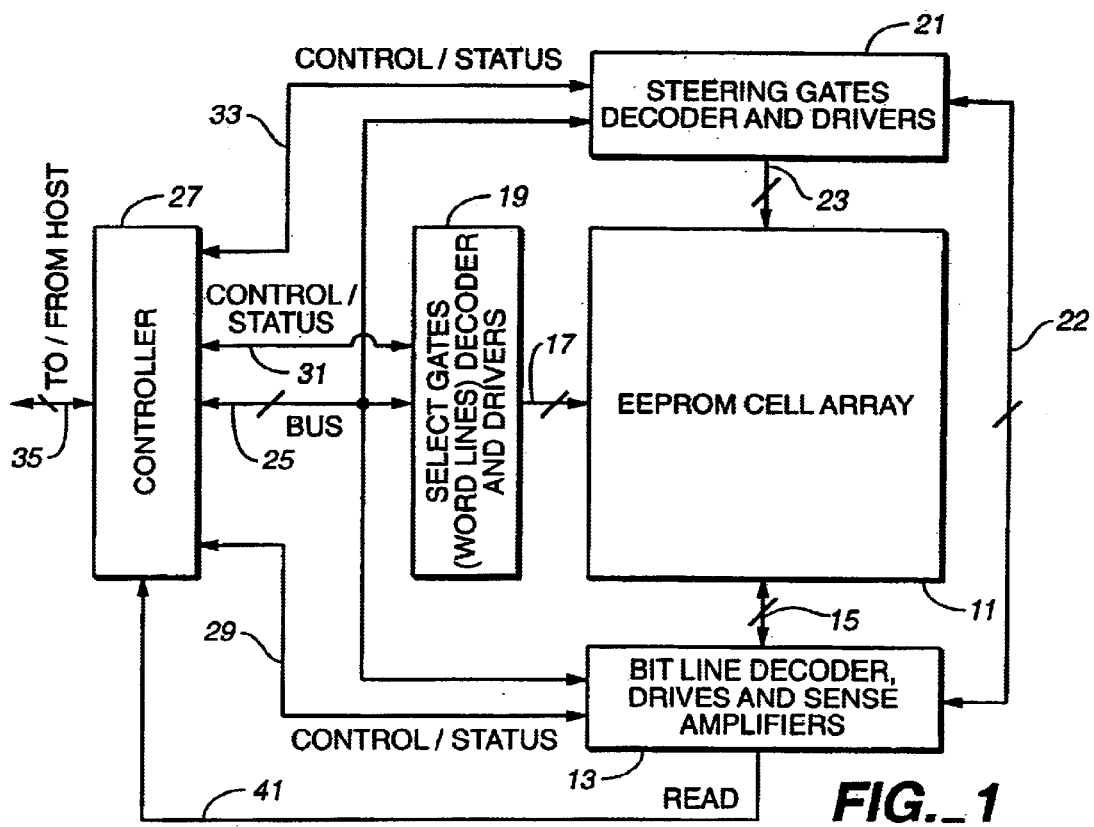
FIG._1
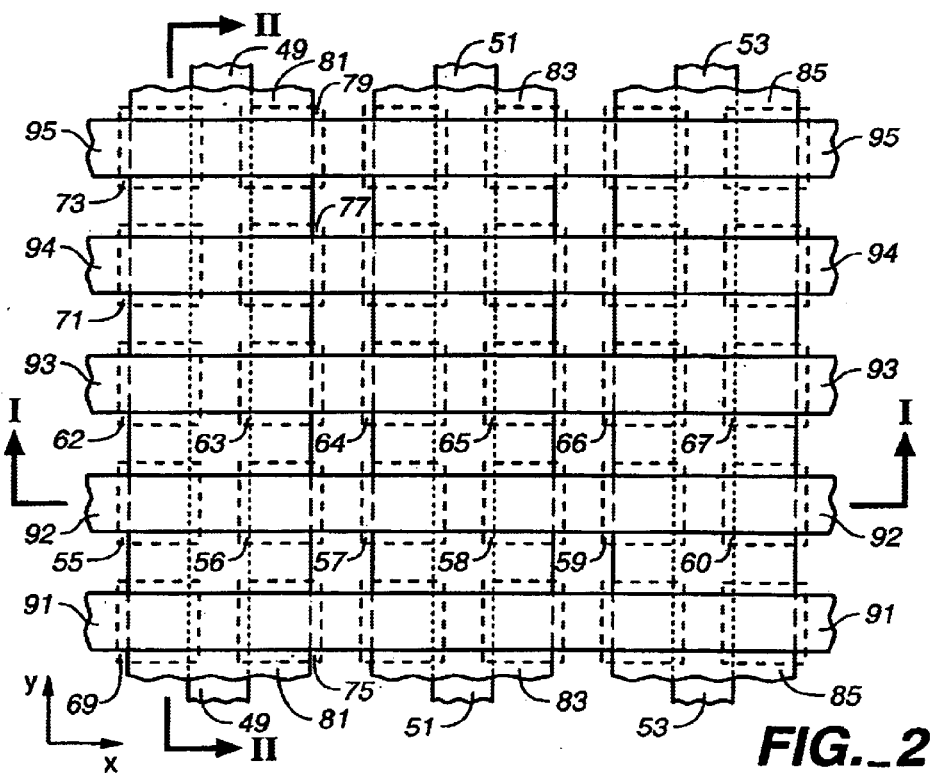
FIG._2

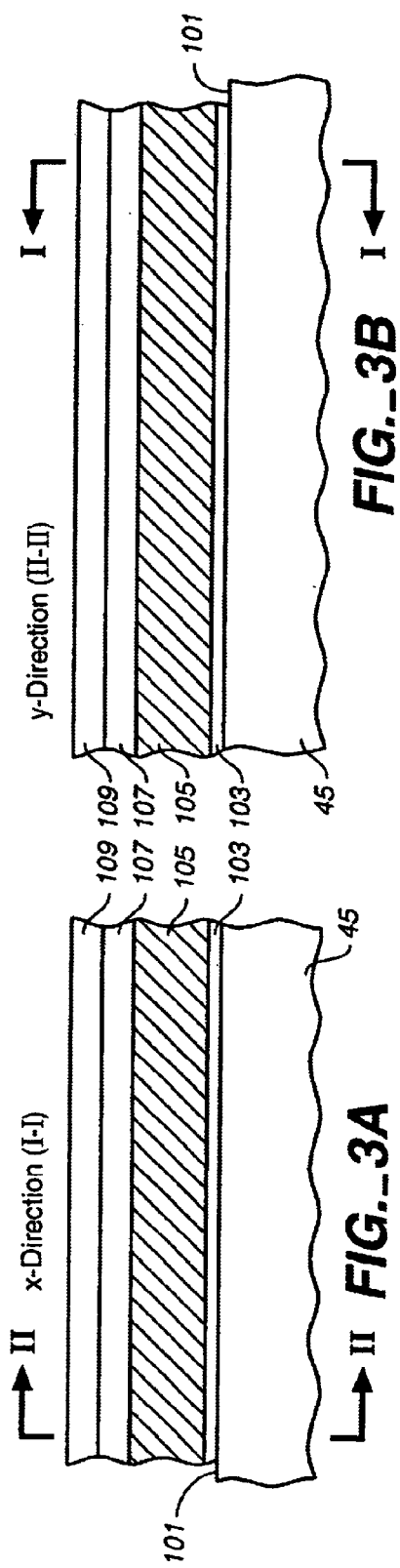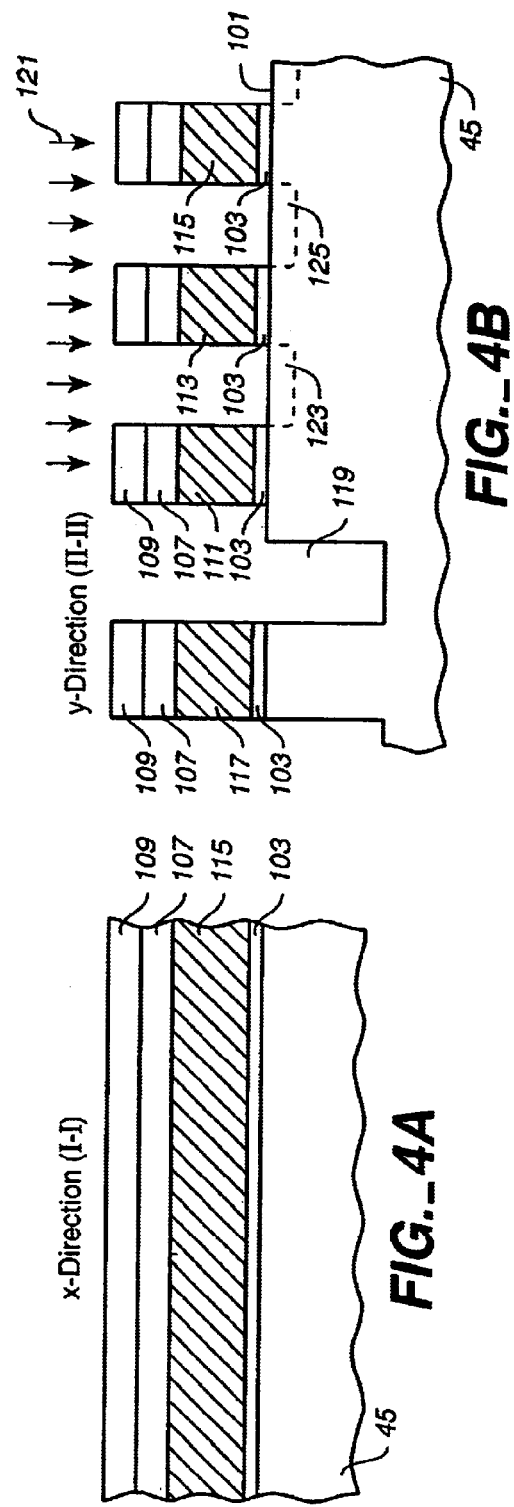

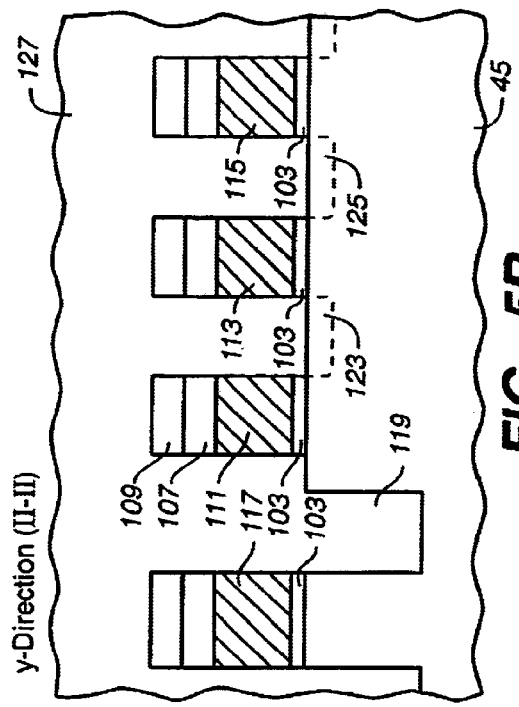
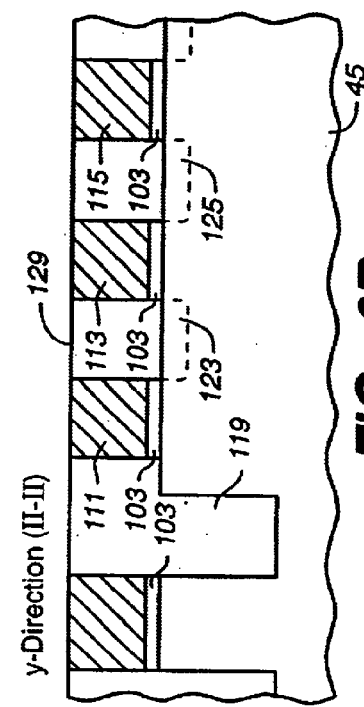
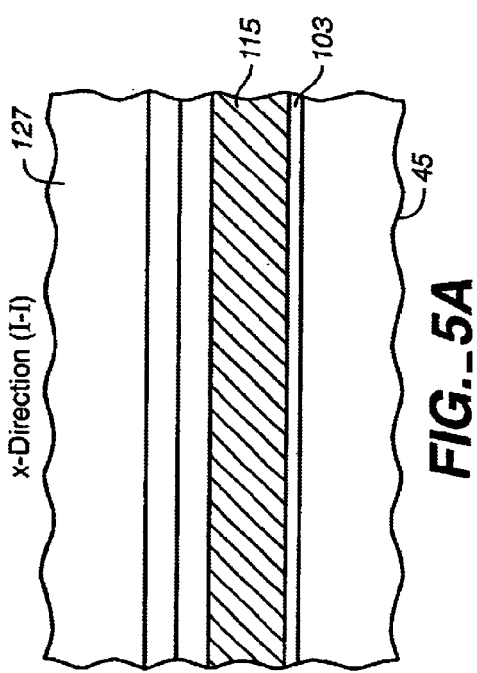
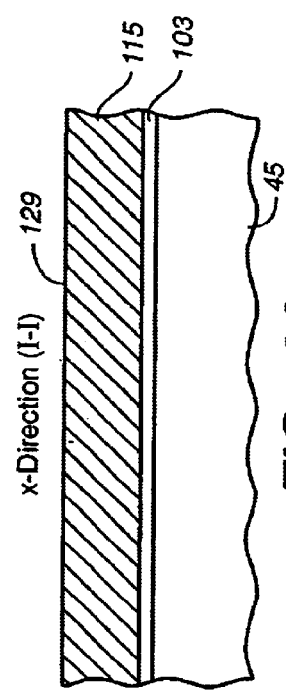

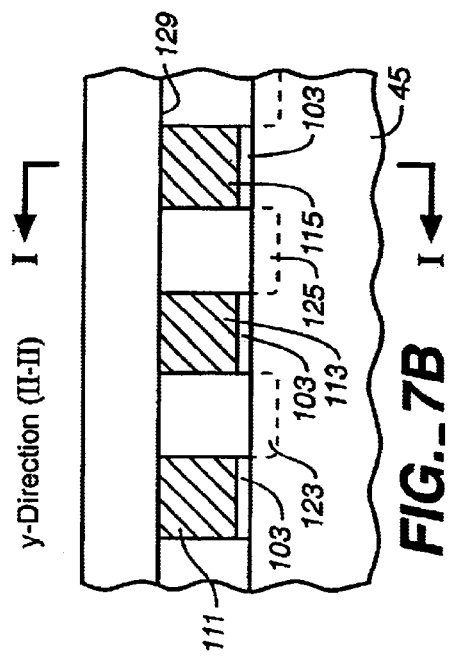
FIG._7B
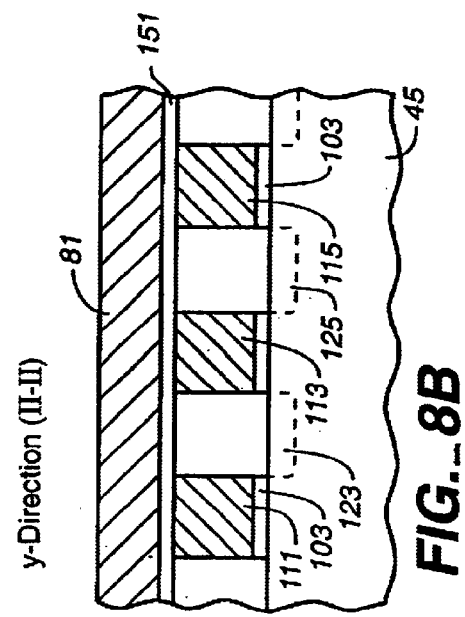
FIG._8B
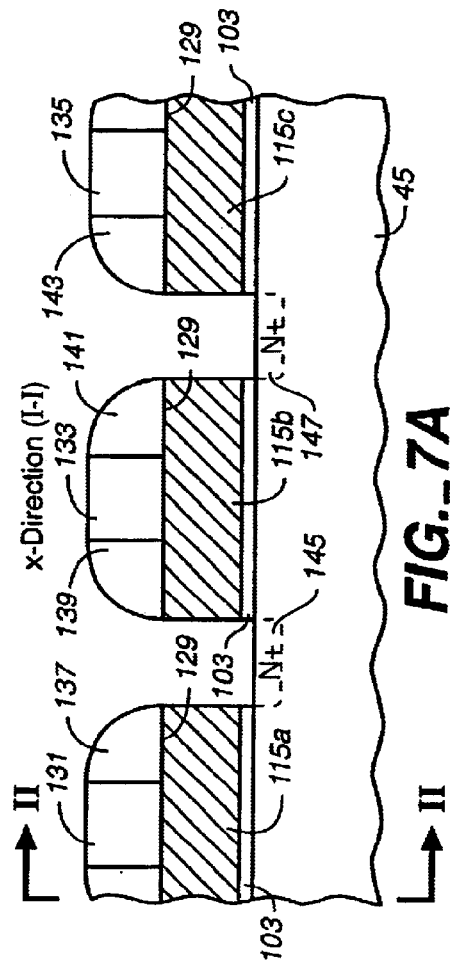
FIG._7A
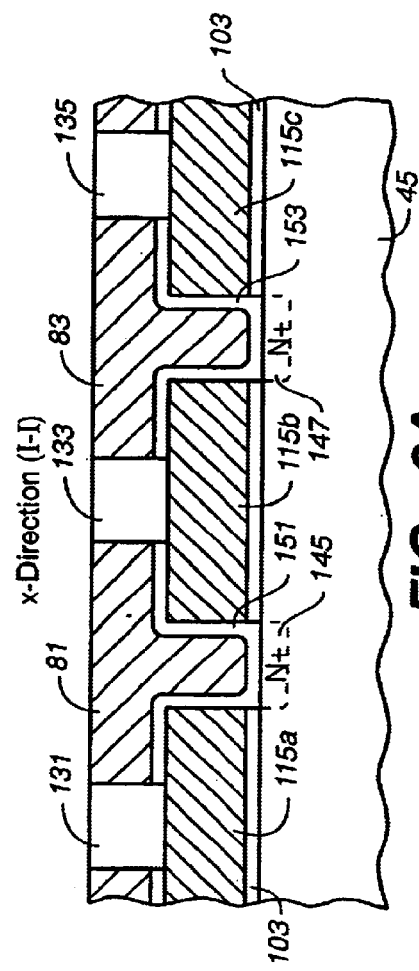
FIG._8A

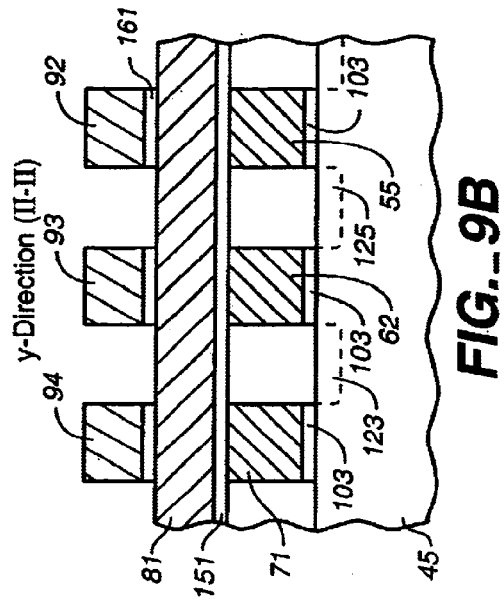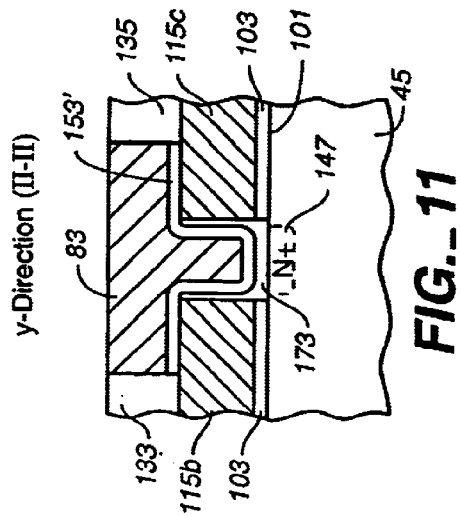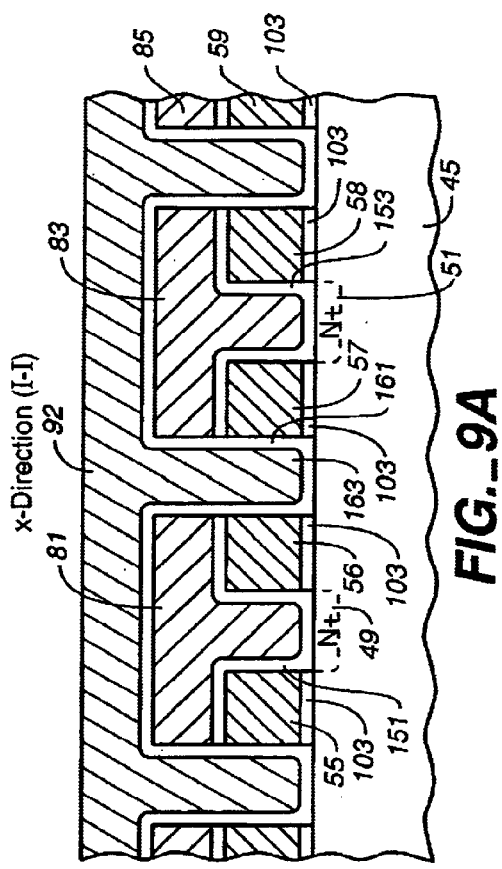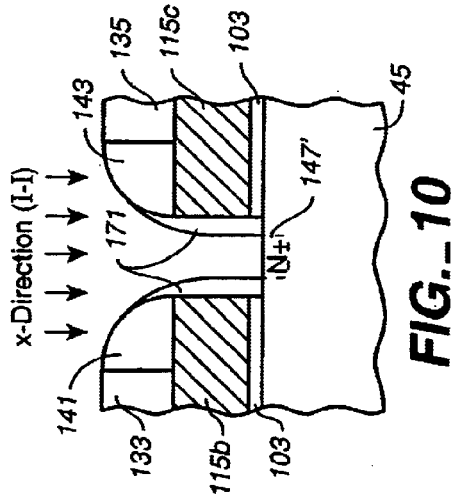

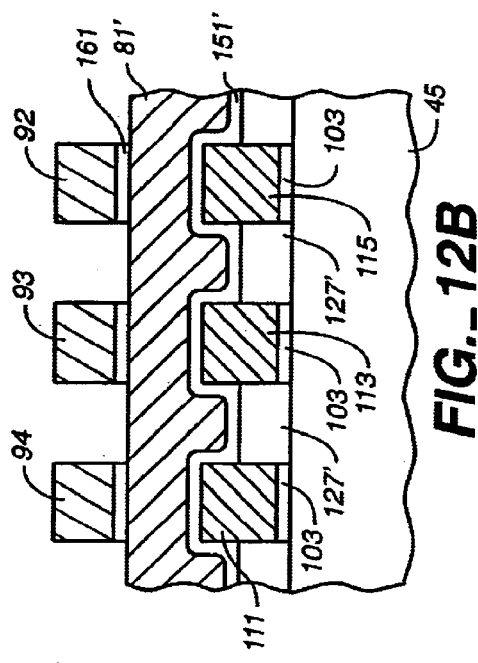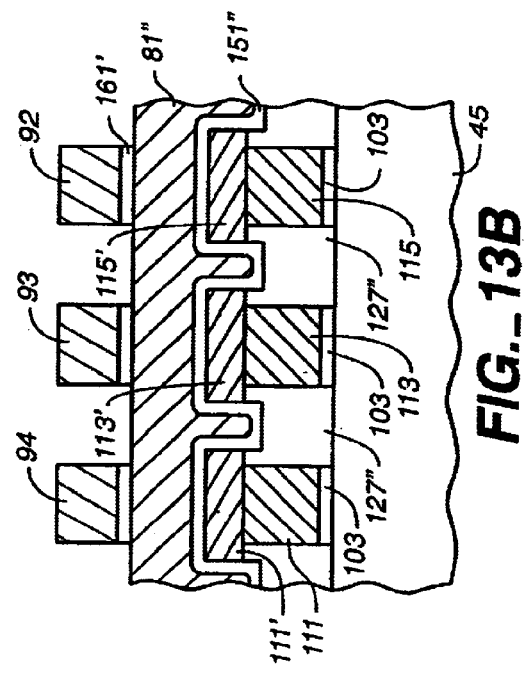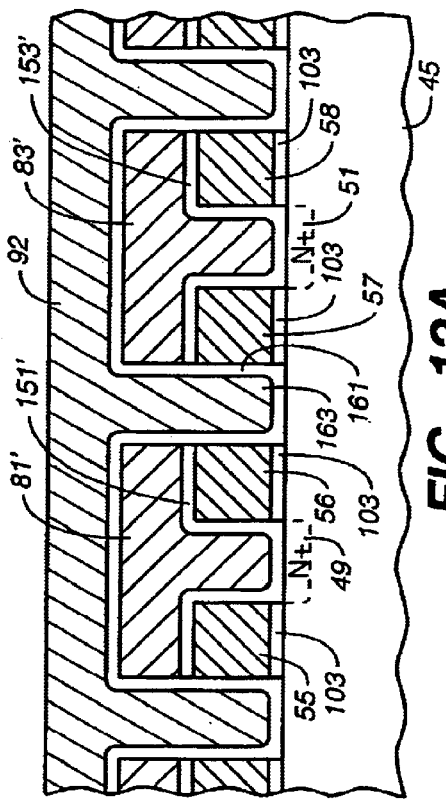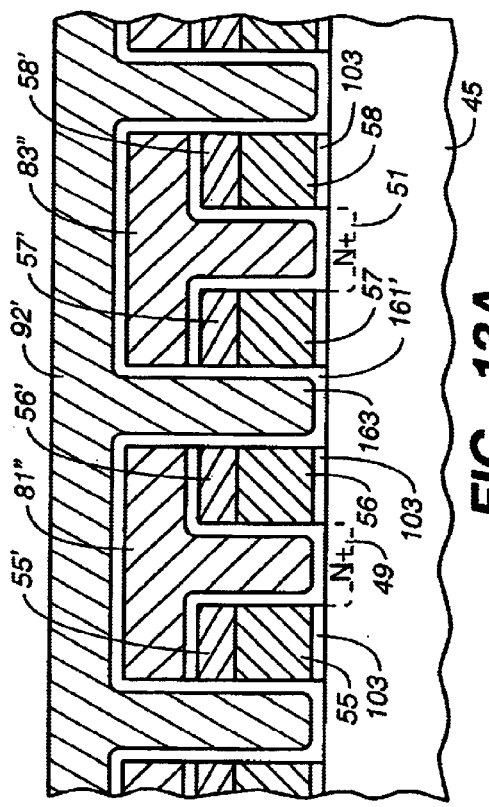

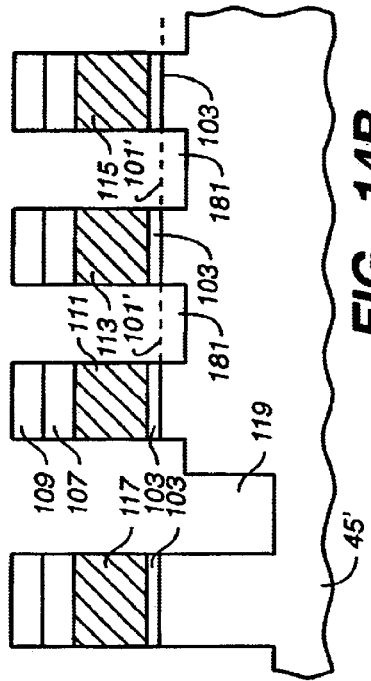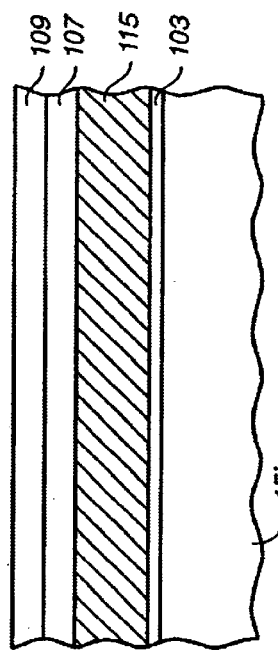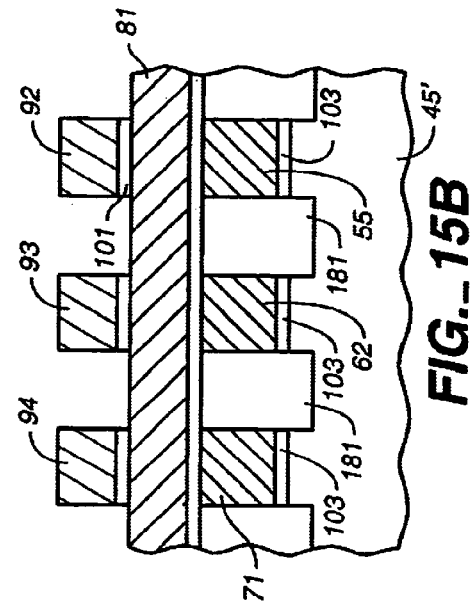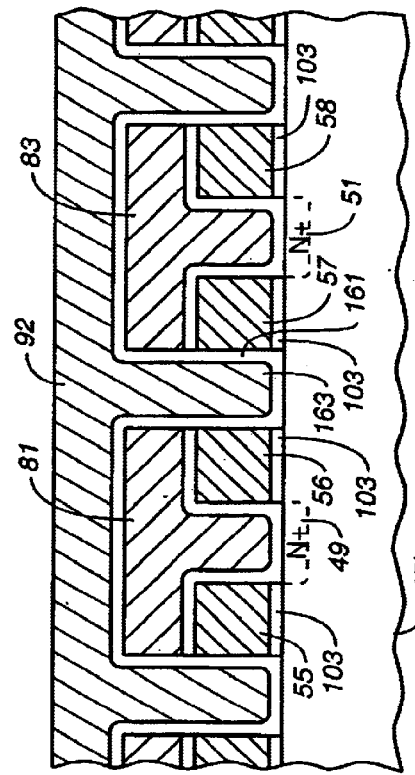

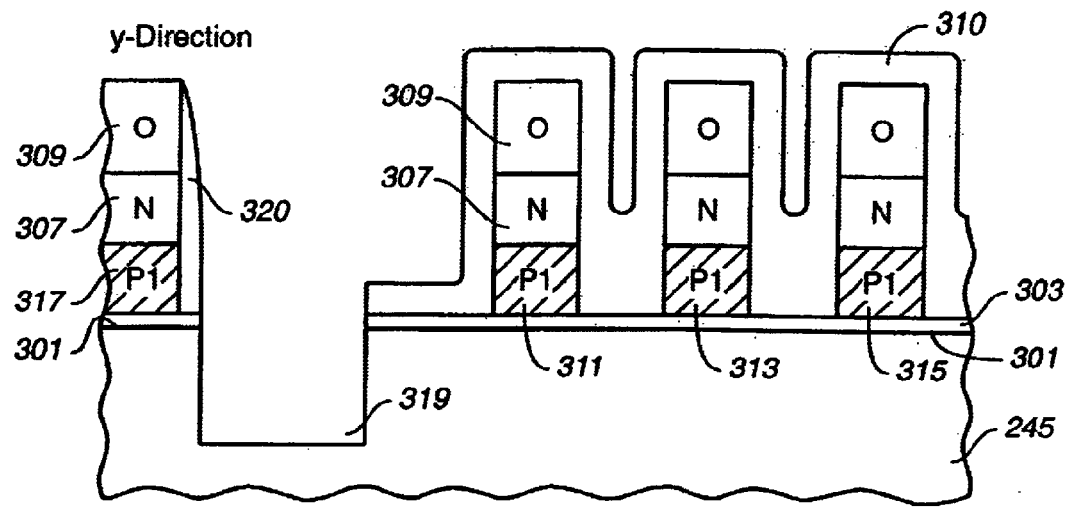
FIG._16
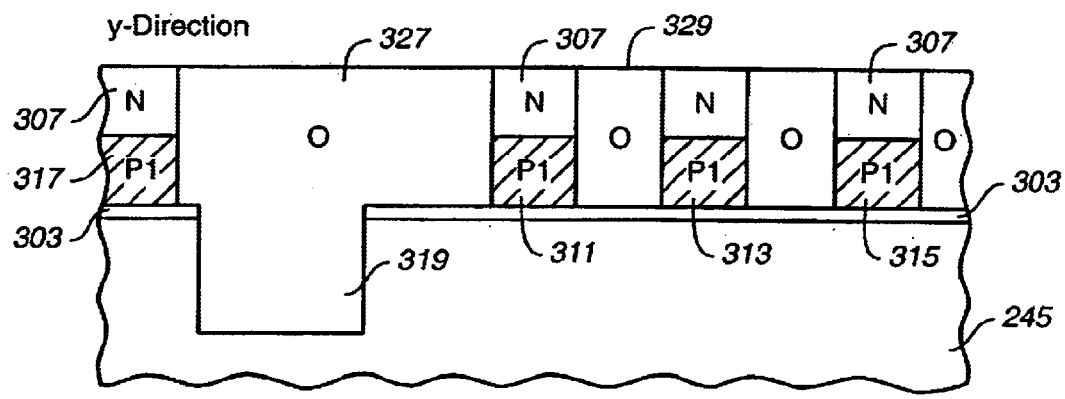
FIG._17
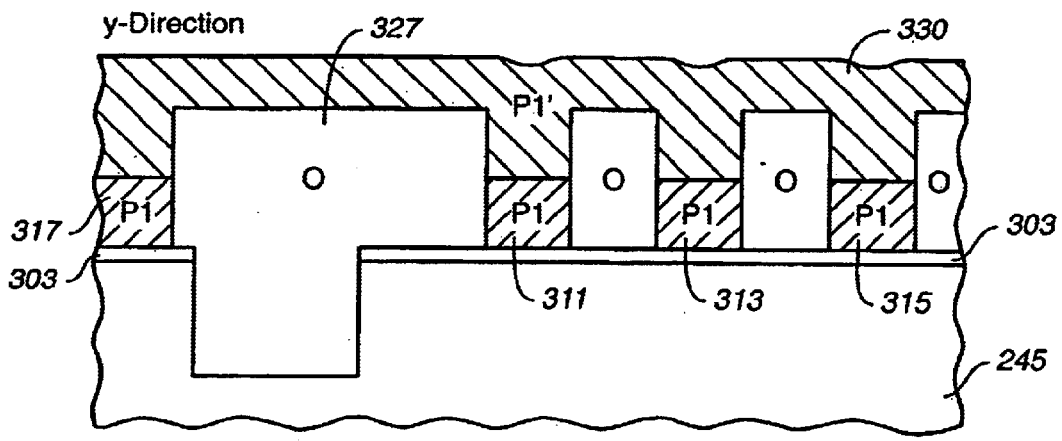
FIG._18

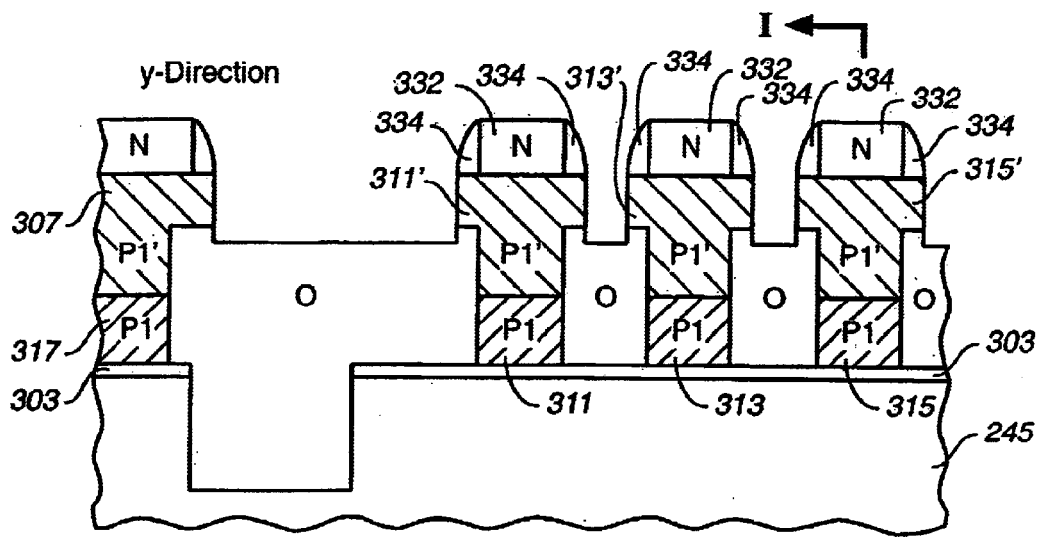
FIG._19
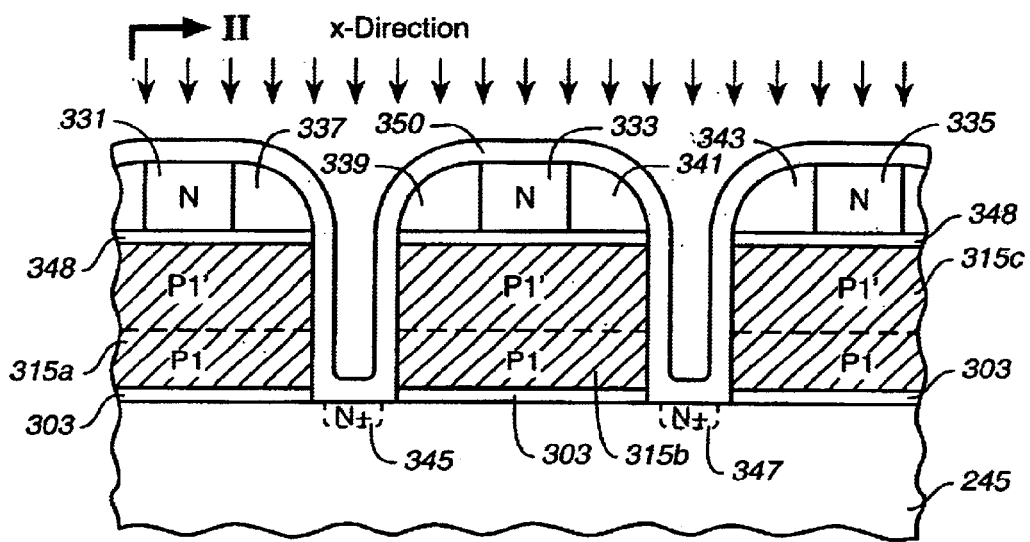
FIG._20
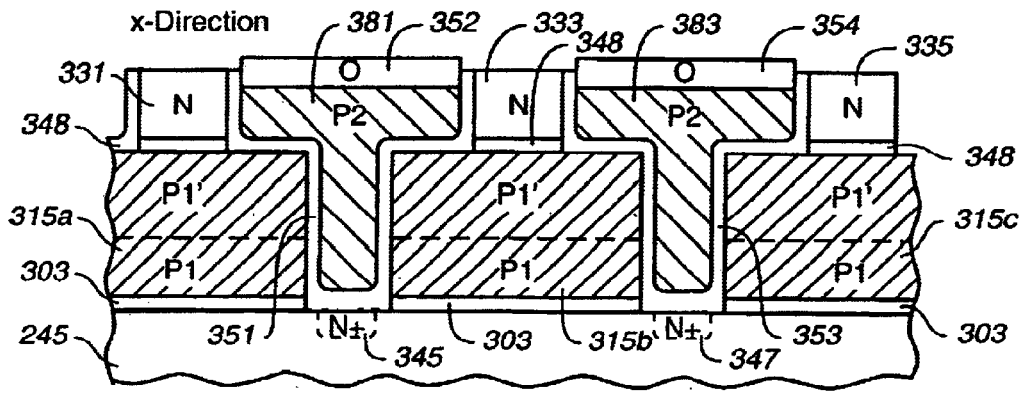
FIG._21

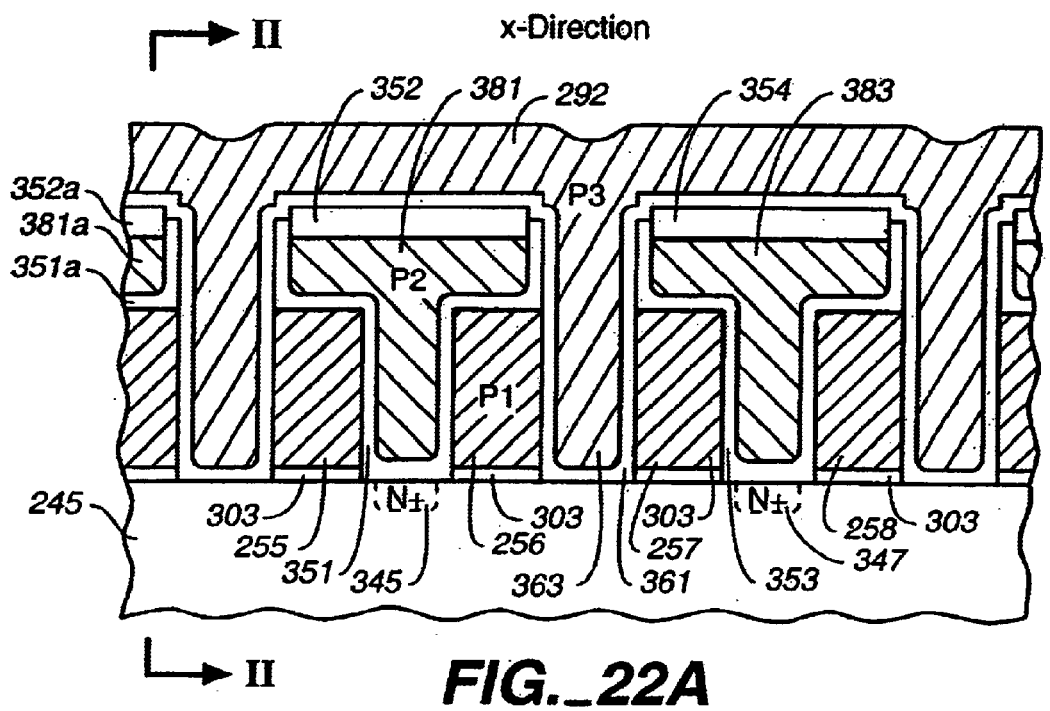
FIG._22A
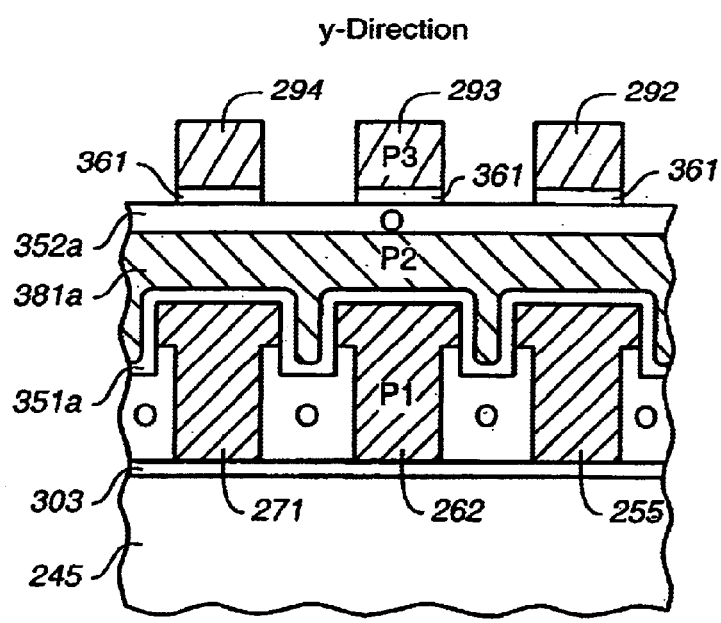
FIG._22B

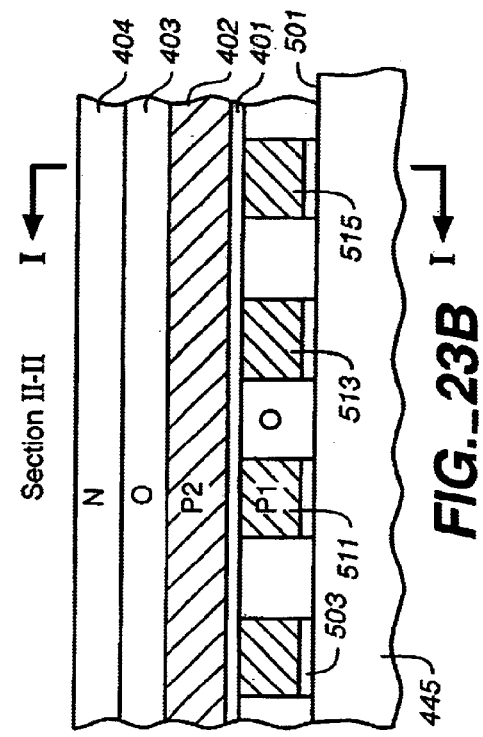
FIG._23A
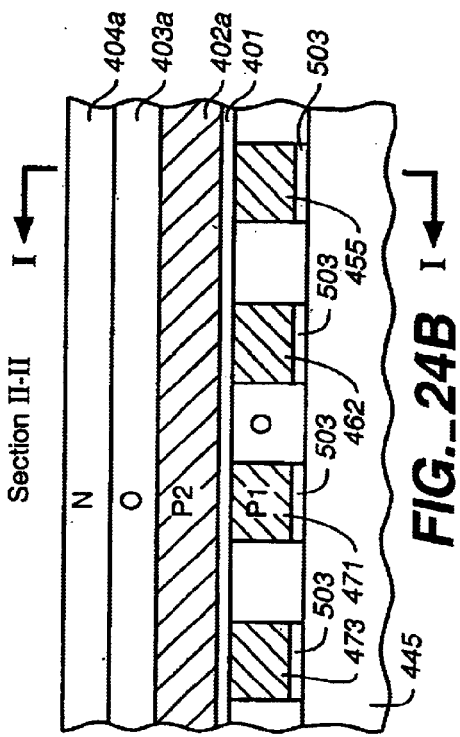
FIG._23B
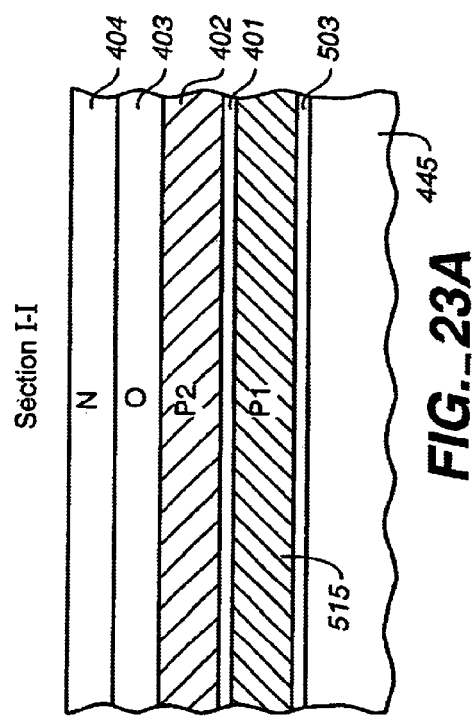
FIG._24A
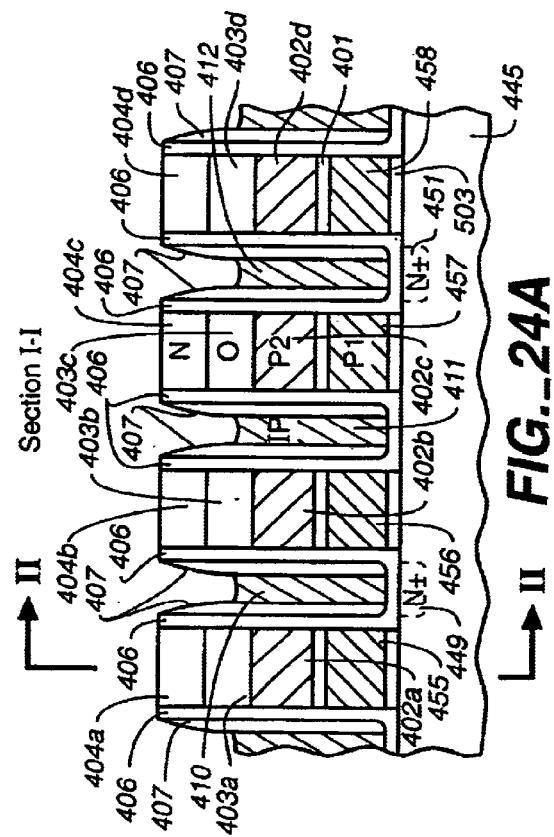
FIG._24B

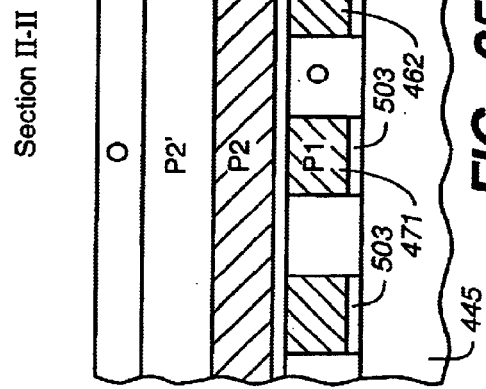
FIG._25B
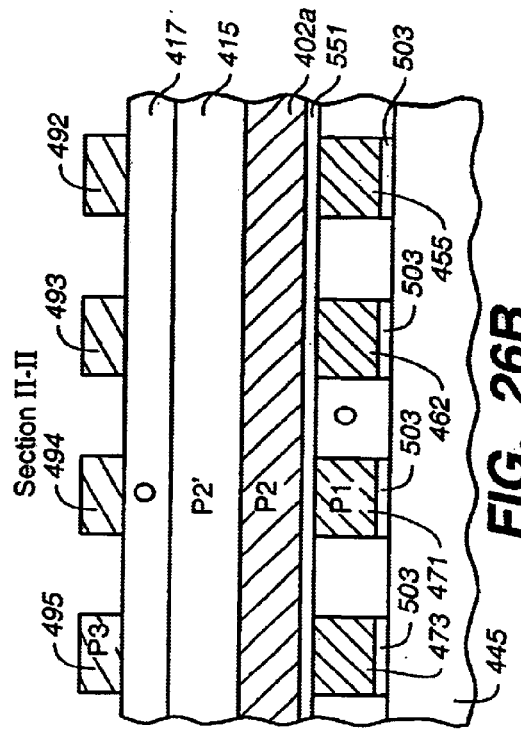
FIG._26B
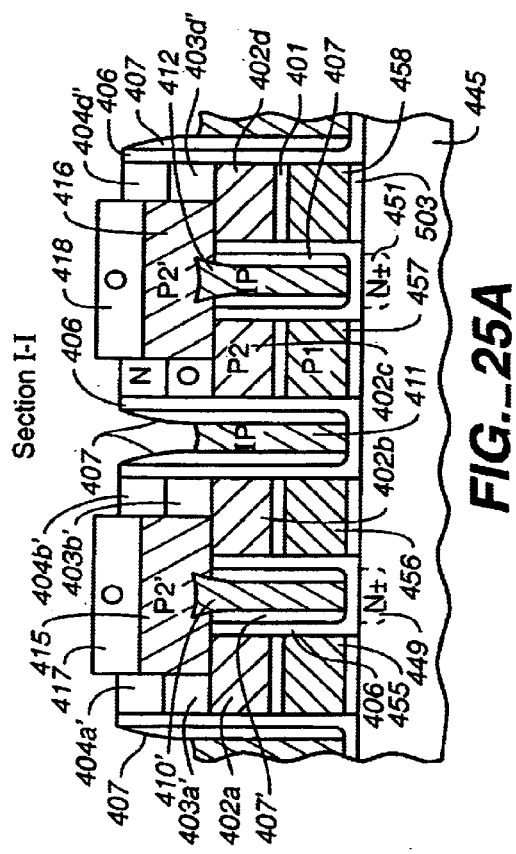
FIG._25A
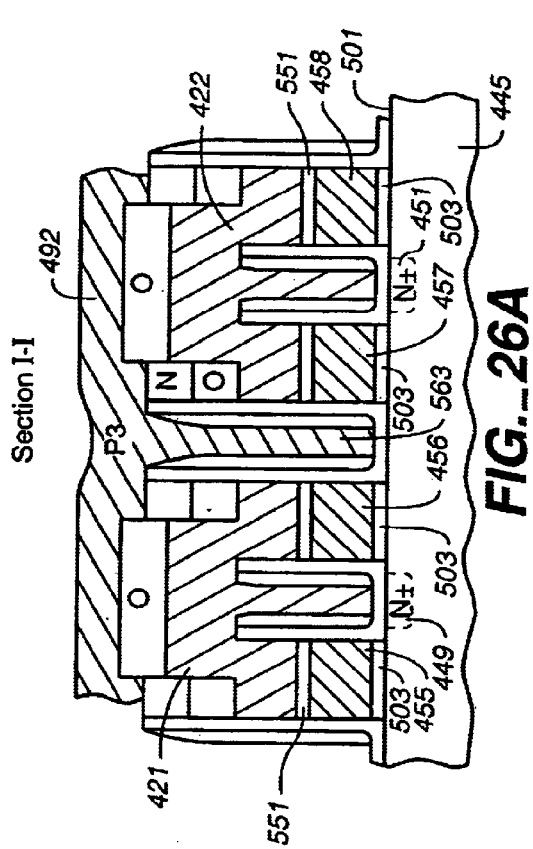
FIG._26A

SCALABLE SELF-ALIGNED DUAL FLOATING GATE MEMORY CELL ARRAY AND METHODS OF FORMING THE ARRAY

CROSS-REFERENCE TO RELATED PATENTS AND APPLICATION

This application is related to U.S. Pat. Nos. 6,103,573 and 6,151,248, and application Ser. No. 09/667,344, filed Sep. 22, 2000, which patents and application are expressly incorporated herein in their entirety by this reference.

FIELD OF THE INVENTION

This invention relates generally to non-volatile flash memory systems, and, more specifically, to the process of forming memory arrays of memory cells that individually contain two floating gates and the resulting structure.

BACKGROUND OF THE INVENTION

There are many commercially successful non-volatile memory products being used today, particularly in the form of small form factor cards, which use an array of flash EEPROM (Electrically Erasable and Programmable Read Only Memory) cells having a "split-channel" between source and drain diffusions. The floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in co-pending U.S. patent application Ser. No. 09/239,073, filed Jan. 27, 1999, which patents and application are incorporated herein by this reference.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762, which patents incorporated herein by this reference.

In either of the two types of memory cell arrays described above, the floating gate of a cell is programmed by injecting electrons from the substrate to the floating gate. This is accomplished by having the proper doping in the channel region and applying the proper voltages to the source, drain and remaining gate(s). So-called "source side" injection is preferred, which is also described in the foregoing U.S. Pat. No. 5,313,421.

Two techniques for removing charge from floating gates to erase memory cells are used in both of the two types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data equal to many disk sectors worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Therefore, in order to further increase data storage density, a flash EEPROM system using a dual floating gate memory cell is being utilized along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. Examples of this cell array architecture and operating techniques are described in U.S. Pat. No. 5,712,180.

SUMMARY OF THE INVENTION

According to one aspect of the present invention, a memory array is made by forming a thin layer of dielectric on the substrate surface and then depositing over it a layer of material that is later separated into conductive floating gates. This dielectric layer, which is preferably a grown oxide, remains as the memory cell floating gate dielectric, and is of high quality because of being formed over a virgin substrate surface. This improves the memory erasure operation when the floating gates are erased to the substrate. The floating gate material is preferably doped polysilicon. Continuous source and drain diffusions in the substrate surface extend across rows of floating gates in a columnar direction. Electrical isolation between rows of floating gates is provided by a field dielectric, such as oxide, that is deposited between the rows above the surface of the substrate. Further isolation may be provided by forming a trench into which the field dielectric extends but which is shallow enough to not interrupt the conductivity of the source and drain diffusions that it crosses. Use of continuously conductive diffusions reduces the complexity of the conductive bit lines that connect with the diffusions.

According to another aspect of the present invention, the area of coupling of a control gate with floating gates is increased by either (1) wrapping the control gate across the top and around the sides of thick floating gates, or (2) increasing the top width of the floating gates that communicates with control gates from a supplemental deposition of conductive material that extends over the floating gates and adjacent dielectric material in at least one direction.

According to a further aspect of the present invention, peripheral circuit elements, such as those of decoders, registers, sense amplifiers, comparators and the like, are isolated from the memory cell array by a trench that is filled with field dielectric, according to a standard Shallow Trench Isolation (STI) technique. Such isolation need not be used within the array itself.

According to yet another aspect of the present invention, continuous strips of floating gate material are separated into individual floating gates by a single etching operation that is followed by forming substantially the same structure of conductive elements, preferably made of doped polysilicon, in each of the spaces between the floating gates that result from the etching. This method eliminates the need for a second etching of the floating gate material strips in alignment with the first. Every other one of these elements are subsequently joined with additional conductive material to form the steering gates. Word lines are later formed of conductive material to contact the remaining every other one of these elements in one direction across the array that then operate as the select transistor gates.

The foregoing individual aspects of the present invention, and various other processing improvements described herein, may be implemented by themselves or in various combinations. Another aspect of the present invention is the implementation of one or more of these aspects within a virtual ground array of dual floating gate memory cells, the form of non-volatile memory in which detailed examples of such implementation are described below. Additional aspects, advantages and features of the present invention are included in the following description of these detailed examples, which description should be taken in conjunction with the accompanying drawings.

BRIEF DESCRIPTION OF THE DRAWINGS

FIG. 1 illustrates in block diagram form a flash EEPROM system in which the various aspects of the present invention may be implemented;

FIG. 2 is an exemplary plan view of a dual floating gate memory cell array that incorporates the present invention;

FIGS. 3A and 3B are sections taken across the memory cell array of FIG. 2, in respective directions I—I and II—II, at an initial stage of the array's formation, according to a first embodiment;

FIGS. 4A and 4B are sections taken across the memory cell array of FIG. 2, in respective directions I—I and II—II, at a first subsequent stage of the array's formation, according to the first embodiment;

FIGS. 5A and 5B are sections taken across the memory cell array of FIG. 2, in respective directions I—I and II—II, at a second subsequent stage of the array's formation, according to the first embodiment;

FIGS. 6A and 6B are sections taken across the memory cell array of FIG. 2, in respective directions I—I and II—II, at a third subsequent stage of the array's formation, according to the first embodiment;

FIGS. 7A and 7B are sections taken across the memory cell array of FIG. 2, in respective directions I—I and II—II, at a fourth subsequent stage of the array's formation, according to the first embodiment;

FIGS. 8A and 8B are sections taken across the memory cell array of FIG. 2, in respective directions I—I and II—II, at a fifth subsequent stage of the array's formation, according to the first embodiment;

FIGS. 9A and 9B are sections taken across the memory cell array of FIG. 2, in respective directions I—I and II—II, at a sixth subsequent stage of the array's formation, according to the first embodiment;

FIG. 10 illustrates a modification to the process and structure shown in FIG. 7A;

FIG. 11 illustrates a modification to the process and structure shown in FIG. 8A;

FIGS. 12A and 12B are sections taken across the memory cell array of FIG. 2, in respective directions I—I and II—II, and illustrate a modification to the process and structure shown in respective FIGS. 9A and 9B;

FIGS. 13A and 13B are sections taken across the memory cell array of FIG. 2, in respective directions I—I and II—II, and illustrate another modification to the process and structure shown in respective FIGS. 9A and 9B;

FIGS. 14A and 14B are sections taken across the memory cell array of FIG. 2, in respective directions I—I and II—II, and illustrate a modification to the process and structure shown in respective FIGS. 4A and 4B;

FIGS. 15A and 15B are sections taken across the memory cell array of FIG. 2, in respective directions I—I and II—II, and further illustrate the modification of respective FIGS. 14A and 14B in a later stage corresponding to respective FIGS. 9A and 9B;

FIG. 16 is a sectional view taken across section II—II the memory cell array of FIG. 2 at a first stage of the array's formation according to a second embodiment;

FIG. 17 is a sectional view taken across section II—II the memory cell array of FIG. 2 at a second stage of the array's formation according to a second embodiment;

FIG. 18 is a sectional view taken across section II—II the memory cell array of FIG. 2 at a third stage of the array's formation according to a second embodiment;

FIG. 19 is a sectional view taken across section II—II the memory cell array of FIG. 2 at a fourth stage of the array's formation according to a second embodiment;

FIG. 20 is a sectional view taken across section I—I the memory cell array of FIG. 2 at a fifth stage of the array's formation according to a second embodiment;

FIG. 21 is a sectional view taken across section I—I the memory cell array of FIG. 2 at a sixth stage of the array's formation according to a second embodiment;

FIGS. 22A and 22B are sections taken across the memory cell array of FIG. 2, in respective directions I—I and II—II, at a seventh stage of the array's formation, according to the second embodiment;

FIGS. 23A and 23B are sections taken across the memory cell array of FIG. 2, in respective directions I—I and II—II at a first stage of the array's formation, according to a third embodiment;

FIGS. 24A and 24B are sections taken across the memory cell array of FIG. 2, in respective directions I—I and II—II at a second stage of the array's formation, according to a third embodiment;

FIGS. 25A and 25B are sections taken across the memory cell array of FIG. 2, in respective directions I—I and II—II, at a third stage of the array's formation, according to a third embodiment; and FIGS. 26A and 26B are sections taken across the memory cell array of FIG. 2, in respective directions I—I and II—II, at a fourth stage of the array's formation, according to a third embodiment.

DETAILED DESCRIPTION OF EXLEMPARY EMBODIMENTS

An example memory system incorporating the various aspects of the present invention is generally illustrated in the block diagram of FIG. 1. A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the Compact-Flash™ Association, the MMC™ Association, and others. When in a card format, the lines 35 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 1 are permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of sense amplifiers are usually used in order to be able to read the states of a large number of memory cells in parallel. During reading and program operations, one row of cells is typically addressed at a time through the circuits 19 for accessing a number of cells in the addressed row that are selected by the circuits 13 and 21. During an erase operation, all cells in each of many rows are typically addressed together as a block for simultaneous erasure.

Operation of a memory system such as illustrated in FIG. 1 is further described in patents identified in the Background section above, and in other patents assigned to SanDisk Corporation, assignee of the present application. In addition, U.S. patent application Ser. No. 09/793,370, filed Feb. 26, 2001, describes a data programming method, which application is incorporated herein by this reference.

A plan view of an example memory cell array 11 is shown in FIG. 2, wherein a small part of its repetitive structure of conductive elements are illustrated with little detail of dielectric layers that exist therebetween. A usual silicon substrate 45 includes a uniform, preferably substantially planar, top surface 47. Elongated diffusions 49, 51 and 53 are formed in the substrate 45 through the surface 47 by an initial ion implantation and subsequent diffusion, and serve as sources and drains of the memory cells formed between them. In order to provide a convention for this description, the diffusions are shown to be spaced apart in a first x-direction, with lengths extending in a second y-direction, these first and second directions being essentially orthogonal with each other. A large number of floating gates are included across the substrate surface 47 with suitable gate dielectric therebetween, in an array of rows and columns. One row of floating gates 55–60 is adjacent to and parallel with another row of floating gates 62–67, for example, and a column of floating gates 69, 55, 62, 71 and 73 is adjacent to and parallel with a column of floating gates 75, 56, 63, 77 and 79. The floating gates are formed from a first layer of conductively doped polycrystalline silicon ("polysilicon") that is deposited over the entire surface and then separated, by etching through one or more masks, into the individual floating gates. The source and drain diffusions 49, 51 and 53 extend continuously in the y-direction across a large number of rows of floating gates.

The bit line decoder and driver circuit 13 (FIG. 1) is connected through lines 15 with all of the bit line source/drain diffusions of the array, including the diffusions 49, 51 and 53 of FIGS. 2–4. The sources and drains of columns of individual memory cells are connected to proper programming voltages for either reading or programming in response to addresses supplied over the bus 25 and control signals over the lines 19.

Rather than employing a separate steering gate for each column of floating gates, the structure of FIG. 2 uses one wider steering gate for every two columns of floating gates. Steering gates 81, 83 and 85 are elongated in the y-direction and have a width in the x-direction that extends across two adjacent columns of floating gates and a source/drain diffusion that is positioned in between them. The space between any two of the steering gates is at least as great as the space in the x-direction between adjacent columns of floating gates that are overlaid by the two steering gates, in order to allow a gate to be later formed at the substrate in this space. The steering gates are formed by etching a second layer of conductively doped polysilicon that is deposited over the entire surface, over the first polysilicon layer and an appropriate inter-polysilicon layer dielectric. The steering gate decoder and driver circuit 21 (FIG. 1) connects though lines 23 to all the steering gates and is able to individually control their voltages in response to addresses provided on the bus 25, control signals in the lines 33, and data from the drivers and sense amplifiers 13.

Word lines 91–95 of FIG. 2 are elongated in the x-direction and extend over the steering gates with spaces between them in the y-direction that places each word line in alignment with a row of floating gates. The word lines are formed by etching a third layer of conductively doped polysilicon that is deposited over the entire surface on top of a dielectric that is first formed over the second polysilicon layer and regions exposed between the steering gates. The word lines allow selection of all the memory cells in its row for reading or writing. The select gate decoder and driver circuit 19 (FIG. 1) is connected with each word line in order to individually select one row of the cell array. Individual cells within a selected row are then enabled for reading or writing by the bit line and steering gate decoder and driver circuits 13 and 21.

Although the gates in the foregoing structure are preferably made of doped polysilicon material, other suitable electrically conductive materials may be used in place of one or more of the three polysilicon layers described. The third layer, for example, from which the word lines and select gates are formed, may be a polycide material, which is polysilicon with a conductive refractive metal silicide on its top, such as tungsten, in order to increase its conductivity. Polycides are generally not used in place of either the first or second polysilicon layers because the quality of oxide grown from a polycide is usually not satisfactory.

Not shown in FIG. 2 are the metal conductor layers. Since the diffusions and polysilicon elements usually have a conductivity that is significantly less than that of metal, metal conductors are included in separate layers, with connections made to respective metal lines through any intermediate layers at periodical intervals along the lengths of the polysilicon elements and diffusions. Since all of the diffusions and polysilicon elements shown in FIG. 2 need to be separately driven, there is a one-to-one correspondence between the number of these metal lines and the number of diffusions and polysilicon elements.

First Processing Example

FIGS. 3–9 illustrate a sequence of steps utilized according to one aspect of the present invention to form the array of FIG. 2, by showing sectional views of FIG. 2 across sections I—I (part A of each figure) and section II—II (part B of each figure). Referring initially to FIGS. 3A and 3B, the result of several initial steps in the semiconductor processing are illustrated. A thin (such as 80–100 Angstroms thick) layer 103 of oxide dielectric is grown over the entire surface 101 of the silicon substrate 45. Next, a thick (such as 500–3000 Angstroms) layer 105 of polysilicon is deposited over the dielectric layer 103. The thickness of the layer 105 is made to be sufficient to provide an amount of coupling along its sidewalls with later formed steering gates that is desired. This polysilicon may be deposited in a doped form or deposited undoped and then doped in a later step by ion implantation. A dielectric layer is then formed over the polysilicon, shown to be two layers. A layer 107 of silicon nitride is first deposited over the polysilicon layer 105, followed by the deposition of a layer 109 of silicon oxide over the nitride layer 107.

A next series of steps is illustrated by FIGS. 4A and 4B. The oxide layer 109 (FIGS. 3A and 3B) is first patterned by the use of an appropriate photoresist mask (not shown) into strips through which the stack of layers 103, 105 and 107 is etched. This leaves polysilicon strips 111, 113 and 115 in an area of the integrated circuit where the array of memory cells are being formed. These strips are elongated in the x-direction and spaced apart in the y-direction. As an alternative to using the oxide layer 109 as an etch mask, a photoresist etch mask may be formed directly on the silicon nitride layer 107.

Peripheral transistor and other devices may be formed, at least in part, simultaneously with the processing steps forming the memory cell array. FIG. 4B shows another strip 117 of polysilicon that is left in an area of the integrated circuit where such peripheral devices are being formed. The peripheral devices and the memory array are preferably isolated by a trench 119 in the substrate 45 that is positioned between the two areas. This trench 119 can be formed by a separate etching step through a photoresist mask. This mask need not necessarily be self-aligned with the polysilicon strips. The trench 119 can surround, or surround most of the area in which the memory cell array is being formed. The trench 119 is preferably made to have a depth of from 1000–4000 Angstroms below the substrate surface 101.

An ion implant 121 may be made in the substrate in between the polysilicon strips in the memory cell area at this stage, such as implant strips 123 and 125, using the strips and dielectric on top of them as a mask. This is done as part of providing isolation between memory cell rows. Boron ions are implanted.

As illustrated by FIGS. 5A and 5B, a next step is to deposit a very thick layer of field dielectric 127, such as silicon oxide, over the entire circuit structure. This then fills in the spaces between the polysilicon strips 111, 113 and 115, as well as the isolation trench 119. This forms an electrical isolation between the eventual rows of floating gates that are formed from these polysilicon strips. The trench 119 and its dielectric filler are formed according to shallow trench isolation (STI) techniques.

A next step, as shown by FIGS. 6A and 6B, is to remove the top of the field dielectric 127 and the dielectric layers 107 and 109 on the polysilicon strips to preferably form a planar surface 129, in one example. This is preferably done by a combination of chemical-mechanical-polishing (CMP), which will remove the filed dielectric 127 and oxide strips 109 down to the nitride strips 107 as a stop, and a further etching step to remove the nitride strips 107 and the field oxide 127 between them.

In subsequent steps illustrated by FIGS. 7–9, the polysilicon strips 111, 113 and 115 are etched twice in order to form the individual floating gates, and the steering gates (elongated in the y-direction) and select gates (part of the word lines elongated in the x-direction) are formed from respective second and third polysilicon layers. This may be done by forming a photoresist mask on the surface 129 of FIGS. 6A and 6B, and etching through it. But this can have the disadvantage of forming elements not totally self-aligned with each other. Therefore, the self-aligned technique described with respect to FIGS. 11–16 of aforementioned incorporated U.S. Pat. No. 6,103,573 is preferred. This technique is briefly summarized with respect to FIGS. 7–9 herein, additional details being provided by the incorporated patent.

Referring to FIGS. 7A and 7B, a set of parallel reference elements 131, 133 and 135 elongated in the y-direction are formed on the surface 129, such as by etching a layer of silicon nitride through a photoresist mask. Spacers 137, 139, 141 and 143 are then formed by depositing a thick layer of silicon oxide over the structure and then anisotropically etching it to leave the spacers. A mask is then formed through which the underlying polysilicon strips 111, 113 and 115 are separated into segments by etching through this mask, such as segments 115a, 115b and 115c formed from the strip 115. Source and drain implants 145 and 147 are then made, using the polysilicon strip segments and the covering dielectric as a mask. Arsenic ions are implanted.

Referring to FIGS. 8A and 8B, the oxide spacers 137, 139, 141 and 143 are removed by a selective etch. Layers 151 and 153 of interpoly dielectric are formed on the exposed surfaces of the polysilicon strip segments, and thus also on exposed portions of the substrate. The preferred interpoly dielectric is a three layer sandwich of oxide-nitride-oxide (ONO). As a specific example, a layer of silicon oxide about 150 Angstroms thick is first grown on the exposed surfaces of the polysilicon strip segments, followed by deposition of about 75 Angstroms of silicon nitride, and then about 50 Angstroms of silicon oxide is formed by a high temperature chemical vapor deposition (CVD) process. A second layer of polysilicon is then deposited on the ONO dielectric layer over the memory cell array and into the spaces between the first polysilicon strip segments. A top portion of the second polysilicon layer is then removed by CMP, or some other suitable material removal process, down to the top of the nitride reference elements 131, 133 and 135, thereby to form isolated steering gates 81 and 83 from the second polysilicon layer, as shown in FIG. 8A.

A next step is to remove the nitride reference elements 131, 133 and 135 from the structure of FIGS. 8A and 8B. The first polysilicon layer strips 115a, 115b and 115c are then etched through resulting spaces between the steering gates, such as a space between steering gates 81 and 83, using the steering gates as a mask. An oxide layer may be grown on the top of the steering gates 81 and 83 prior to such an etch. Such an oxide layer will not be grown over the nitride reference elements 131, 133 and 135, thus allowing them to be selectively etched away.

The resulting openings between the now separated floating gates, such as between floating gates 56 and 57, are shown in FIG. 9A. A layer 161 of interpoly dielectric, preferably ONO, is then formed on exposed sides and tops of the floating and steering gates, as well as over exposed substrate areas. Next, a third layer of polysilicon is deposited over the structure and etched through a photoresist mask (not shown) to form strips elongated in the x-direction and spaced apart in the y-direction. These strips are the word lines of the array, word line 92 being shown in FIG. 9A. Select transistor gates, such as the gate 163, are formed as part of the word lines in the openings formed between floating gates.

This process has several advantageous features. One is that the floating gates formed from the first polysilicon layer are totally self-aligned with the source and drain diffusions and the steering gates. Another is that the floating gate oxide layer 103 is of high quality because it is grown on the virgin substrate and then covered by the first polysilicon layer that is later separated into the floating gates. This allows reliably erasing the floating gates to the substrate by a mechanism of tunneling electrons through the gate oxide, as well as programming by the injection of hot electrons onto the floating gates from the substrate through the gate oxide. Yet another advantage is that field oxide deposited on top of the substrate between rows of floating gates provides isolation between these rows, rather than positioning oxide filled trenches formed according to STI between rows. The absence of such deep trenches allows the source and drain diffusions to be formed continuously across multiple rows of cells rather than using isolated diffusions for each cell and then additional polysilicon bit lines to connect the diffusions in a column together. The omission of the isolation trenches further eliminates sharp corners in the substrate that can cause a breakdown of the floating gate dielectric as the result of field concentrations with adjacent floating gates that can tend to wrap around these corners.

Variations of the First Processing Example

There are many variations and additions to the process described above with respect to FIGS. 3–9 that can be useful in certain situations. Referring to FIG. 10, for example, a modification to the view of FIG. 7A is given. Prior to making the source and drain implants, dielectric spacers 171 are formed along the side walls of adjacent first polysilicon strip segments 115b and 115c. A resulting implant 147' is made through the opening that is restricted by the presence of the spacers 171. As a result, the implant 147' is narrower than the implant 147 of FIG. 7A. Since the implanted ions will migrate during subsequent processing steps that raise the temperature of the structure, this narrow implant compensates to some degree for such migration in order to maintain a desired width of the final source and drain regions. After the implantation, the spacers 171 are removed, the interpoly dielectric layers 151 and 153 are formed and the process continued as previously described.

FIG. 11 shows another modification of the process, this time with respect to FIG. 8A. In order to decrease the coupling between the steering gates and the substrate, a thick layer 173 of dielectric is additionally formed in the spaces shown in FIG. 7A between the segments of the first polysilicon layer strips. This is done after the source and drain implant has occurred but before the interpoly dielectric layers 151 and 153 are formed. Oxide is preferably grown on exposed polysilicon and silicon substrate surfaces. This oxide grows thicker in the region 173 over the doped region 147 of the silicon substrate surface 101 than on the sides of the polysilicon layer strips 115b and 115c. Since the presence of the dielectric 173 reduces the area of coupling between the steering and floating gates, its depth is controlled in order not to be more than necessary to provide the desired degree of field isolation between the steering gates and the substrate.

However, this area of coupling can be increased by another modification of the basic process that is illustrated in FIGS. 12A and 12B. After reaching the stage illustrated in FIG. 6B, a portion of the remaining field dielectric between the first polysilicon layer strips 111, 113 and 115 is removed, to leave the reduced amount 127' shown in FIG. 12B. The subsequently formed steering gates then wrap around the floating gates in the y-direction. This is shown by the steering gate 81' of FIG. 12B extending down a distance along the sides of the floating gates 111, 113 and 115. This feature can be implemented without the feature of FIG. 11 but if used together, the increased coupling in the y-direction (FIG. 12B) compensates for the decreased coupling in the x-direction (FIG. 11).

An alternative technique for increasing the coupling area between the steering and floating gates is illustrated in FIGS. 13A and 13B. After reaching the stage shown in FIGS. 6A and 6B, an additional layer of polysilicon is deposited across the surface 129 and patterned to leave the additional floating gate portions 111', 113' and 115' on top of, and in contact with, the previously formed floating gates 111, 113 and 115. The additional floating gate portions preferably have the same dimension as the underlying floating gates in the x-direction (FIG. 13A) but somewhat longer in the y-direction (FIG. 13B). It is this longer dimension that increases the top area of the floating gate that is coupled with the steering gate 81". Further, the steering gates can be extended down in between the floating gates, as shown in FIG. 13B, which provides additional coupling through the edges of the additional floating gate portions. The configuration shown also uses the steering gates to provide shielding between adjacent additional floating gate portions which are closer together in the y-direction than the floating gates without the additional portions. An example technique for forming such T-shaped floating gates is described hereinafter.

Another modification of the process and structure of FIGS. 3–9 is illustrated in FIGS. 14 and 15. Here, very shallow trenches are etched in the substrate surface between the rows of floating gates and filled with the field oxide that is deposited betweens the rows, in order to increase the degree of electrical isolation between adjacent rows. FIGS. 14A and 14B correspond, respectively, to FIGS. 4A and 4B, the difference being the addition of the very shallow trenches 181 in the substrate 45'. These are most easily formed as an extension of the etching of the first polysilicon layer that is described with respect to FIGS. 4A and 4B. The trenches 181 are preferably made from 500 to 1000 Angstroms deep below the surface 101' of the substrate 45'. FIGS. 15A and 15B correspond, respectively, with FIGS. 9A and 9B, and shown the device structure at a later stage of the process. The depth of the trenches 181 (which are elongated in the x-direction) is kept shallow enough that the conduction along the source and drain diffusions (which cross the trenches 181 in the y-direction) is not significantly affected.

The basic process and structures of FIGS. 3–9 may be modified according to one or more of the additional features described with respect to FIGS. 10–15, either alone or in various combinations.

Second Processing Example

FIGS. 16–22 show exemplary sequential cross-sectional views of an integrated circuit structure that illustrate many steps of its formation by a process that corresponds to, but differs in certain respects from, the process described above with respect to FIGS. 3–9. The process illustrated in FIGS. 16–22 includes use of narrow source and drain implants (formed differently in FIG. 10), thickened dielectric layers between the substrate and the select gates (described with respect to FIG. 11), "T" shaped floating gates (as shown generally by FIG. 13B) and a double dielectric layer between the select gates and the word lines for a reduced coupling between them. The reference numbers used in FIGS. 16–22 for corresponding elements in FIGS. 3–9 are those of FIGS. 3–9 with 200 added. For example, the semiconductor substrate in FIGS. 16–22 is labeled "245" while the substrate in FIGS. 3–9 is labeled "45".

FIGS. 16–19 illustrate some of the preliminary processing steps of this second example, as viewed across section II—II (y-direction) of the array of FIG. 2. A thin layer 303 of tunnel oxide, about 90 Angstroms thick, for example, is grown on the substrate's surface 301. A first layer (Pl) of polysilicon about 1000 Angstroms thick is deposited over the layer 303, a layer of silicon nitride about 1000 Angstroms thick then deposited over the polysilicon, and a layer of silicon oxide of about 1500 Angstroms thick is finally deposited over the nitride layer, as a specific example. This three layer stack is then etched through a photoresist mask formed on top of the oxide layer (not shown) into strips having lengths extending in the x-direction and being spaced apart in the y-direction. The view of FIG. 16 is across three such strips in the memory area, polysilicon strips 311, 313 and 315 being formed over the thin oxide layer 301, with similarly shaped strips of the nitride layer 307 and oxide layer 309 on top of the polysilicon. A polysilicon strip 317 is shown in the peripheral region of the device, also in an elongated stack with a portion of the nitride layer 307 and oxide layer 309 on top.

After that etching is completed and the photoresist mask used to perform it has been removed, a layer 310 of oxide about 1000 Angstroms thick is deposited over the stacked strips and the spaces between them. Another photoresist etch mask is then formed over the layer 310 to completely protect the array but leave the peripheral elements exposed. The oxide layer 310 exposed through the mask is then anisotropically etched to remove it from the peripheral region in a manner that leaves a spacer 320 along a side of the stack including the polysilicon layer 317. The oxide on the top of the peripheral stack, the spacer 320 and the remaining portion of the oxide layer 310 that was protected by the mask, then serve together as a mask for etching a trench 319 in the substrate 245. The trench 319, which can be about 3000 Angstroms deep, for example, serves to isolate the peripheral circuit devices from the memory cell array.

FIG. 17 shows a next series of processing steps. The structure is covered with about a 7000 Angstrom layer, as an example, of oxide that fills in the trench 319 and other cavities in the structure, and to a depth over all other elements. This thick oxide layer is then removed, preferably by a CMP process, down to the tops of the nitride strips 307, thereby leaving a planar surface 329. This leaves the trench 319 filled with a volume 327 of oxide, and spaces between the stacks of polysilicon and nitride strips in the memory area also being filled with oxide.

A next step is to remove the nitride 307 from at least the memory cell array region of the device being formed. As shown in FIG. 18, a second polysilicon layer 330 is then deposited into the voids left by removal of the nitride and over the thick oxide that remains between the polysilicon strips 311, 313 and 315. This second polysilicon layer, designated P1', sits on top of the strips formed from the first polysilicon layer, which is designated P1. The two polysilicon layers contact each other to effectively form a single polysilicon structure. If this polysilicon has been deposited in an undoped form, as it is in this example, the structure is then exposed to an arsenic ion implant.

With reference to FIG. 19, the next series of steps are discussed. A layer of silicon nitride is deposited to about a 550 Angstrom thickness, for example, over the polysilicon layer 330. A mask (not shown) is then formed over the nitride layer and positioned in the y-direction to cover strips of nitride as closely aligned over the polysilicon strips 311, 313 and 315 as possible. Etching of the nitride layer through this mask then leaves the strips 332 elongated in the x-direction but spaced apart in the y-direction. This nitride etch mask is not self-aligned with the structure already formed but a slight misalignment does not present a problem.

In order to serve as a mask to etch the polysilicon layer 330 with a line width less than the resolution element of the process being used, spacers 334 are formed along the nitride strips 332. This is done by depositing a layer of nitride about 900 Angstroms thick, in this example, which is then anisotropically etched to remove most of this last layer but leaving the spacers 334. The polysilicon layer 330 is then etched away through the elongated openings between the spacers 334. A small amount of the thick oxide between the polysilicon strips is also preferably removed, as shown in FIG. 19.

After this etching, the elongated P1 polysilicon strips are divided into segments along their length and the steering gates formed. This series of processing steps is illustrated in FIGS. 20 and 21, which are sectional views taken across the x-direction of the array of FIG. 2, at section I—I, perpendicular to the sectional views of FIGS. 16–19 just described. The nitride strips 332 and the spacers 334 (FIG. 19) are first removed, such as by a wet etch. A dielectric layer 348 (FIG. 20) is formed, preferably ONO such as one having 50 Angstroms of oxide grown on the polysilicon strips (HTO, high temperature oxide), 150 Angstroms of nitride deposited and then 200 Angstroms of oxide deposited (TEOS).

Reference elements 331, 333 and 335 are then formed over this dielectric layer 348, which are elongated in the y-direction and spaced apart in the x-direction shown in FIG. 20. These reference elements correspond to elements 131, 133 and 135, respectively of FIG. 7A. To form them, a layer of nitride is deposited over the dielectric layer 348, to a depth of 2500 Angstroms, for example. A photoresist mask (not shown) is then formed on top of this nitride layer, through which the nitride layer is etched to leave the reference element strips 331, 333 and 335. These strips need not be registered in the x-direction with any other elements of the structure.

After removal of the photoresist material from the top of these strips, the spacers 337, 339, 341 and 343 are formed along side them. This is accomplished in this example by a TEOS deposition of BPSG oxide to a depth of about 1800 Angstroms. This layer is then anisotropically etched until all is removed except for the desired spacers.

The reference elements 331, 333 and 335, and the adjacent spacers 337, 339, 341 and 343 then serve as a mask for etching the polysilicon strips and intermediate thick isolation oxide through the elongated slots between adjacent spacers. That etching step is shown in FIG. 20 to have been accomplished. The polysilicon and thick oxide are usually removed in different etching steps with different etchants or processes employed. The result of this etching is the individual polysilicon strip segments 315a, 315b and 315c of equal length, with slots elongated in the y-direction that extend through the polysilicon strips and the thick isolation oxide in between.

A next step is to form a dielectric layer 350 (FIG. 20) as a mask that restricts the width of substrate source and drain implants 345 and 347, in the x-direction to something less than a minimum resolution element of the process being employed. The layer 350 is preferably formed of TEOS dielectric with a thickness of about 500 Angstroms. This layer adheres to the sidewalls of the polysilicon strip segments, which sidewall portions block the ions from reaching the substrate surface 301, but leaves a space between such sidewall portions through which the ions travel to reach the substrate. These implants are continuous in the y-direction across a large number of polysilicon strip segments.

Next, the layer 350 is removed by an appropriate process. The spacers 337, 339, 341 and 343, plus the portions of the dielectric 348 underlying the spacers, are then removed, leaving the reference elements 333 in place, as shown in FIG. 21. A layer of dielectric is then formed over the structure in order to provide interpoly dielectric layers 351 and 353 that extend along exposed polysilicon surfaces within the slots and vertical edges of the nitride reference elements 331, 333 and 335. This dielectric is preferably ONO, formed of an oxide layer grown and deposited on the exposed polysilicon and nitride surfaces to a thickness of about 150 Angstroms, followed by depositing about 75 Angstroms of nitride, and then depositing about 50 Angstroms of oxide by HTO. Growth of the initial oxide will be thicker immediately above the regions 345 and 347 implanted in the substrate, thus providing a desired extra degree of isolation between the later formed steering gates and the substrate. The total thickness, of the layers 351 and 353 above the implanted regions will typically be about 300 Angstroms, in this example.

A layer of doped polysilicon (P2) is then deposited over the structure to a depth of about 3000 Angstroms, in this example, which also then extends into the slots lined by the dielectric layers 351 and 353. This top portion of this polysilicon is then removed by etching or CMP to the level of the tops of the nitride reference elements 331, 333 and 335. This separates the P2 layer into individual steering gates 381 and 383 that are elongated in the y-direction and spaced apart in the x-direction shown in FIG. 21.

In order to provide a mask for an additional etch of the first polysilicon layer strip segments and result in additional isolation of the steering gates from the word lines to be later formed, the structure is oxidized in a manner to grow oxide layers 352 and 354 over the respective doped polysilicon steering gates 381 and 383. A next step is to remove the exposed nitride reference elements 331, 333 and 335. The polysilicon strip segments 315a, 315b and 315c are then etched through the resulting openings between steering gates, to form slots shown in FIG. 22A. A dielectric layer 361 is formed along the sidewalls and bottom of these slots. Ions are then typically implanted into the substrate 245 through these slots in order to adjust the thresholds of the resulting select transistors. An additional amount of select gate oxide can then be grown on the bottom of the slots, as part of the dielectric layer 361 shown in FIG. 21.

The next series of steps form the word lines 292, 293 and 294 (FIGS. 22A and 22B). A layer of doped polysilicon is deposited to a thickness of about 3000 Angstroms, in this specific example, which also causes the polysilicon to extend downward into the slots just formed. This polysilicon layer is then separated by employing an appropriate photoresist mask and etching step to form the individual word lines. The polysilicon of each of the word lines provides the select transistor gates, such as the gate 363 of FIG. 22A.

It will be noted from FIG. 22A that the select gates 381 and 383 are separated from the word line 292 by two layers of dielectric formed at different times, namely layers 351 and 353 combined with the later formed layer 361. This increased thickness dielectric conveniently reduces the amount of coupling between the select gates and the word lines, a desirable result.

FIG. 22B shows the structure at the same point of its processing as FIG. 22A but in an orthogonal section. It will be noted that the steering gate lines formed of the polysilicon layer P2 extend down in between the T-shaped floating gates made from the P1 polysilicon layer, thus to provide a shield against excessive coupling between adjacent floating gates that are very closely separated in the y-direction.

Third Processing Example

Yet another method of forming the same type of array as described above is illustrated in FIGS. 23–26, wherein the "A" portion of each figure is a section of a small portion of the memory cell array being formed, taken at section I—I of FIG. 2 (along the x-axis), and the "B" portion of each figure is a section taken at section II—II of FIG. 2 (along the y-axis). The primary difference between this embodiment and those of the examples described above is that the separation of the first polysilicon strips in the x-direction into individual floating gates occurs during a single masking step, rather than using the nitride reference elements (131, 133, 135 etc. of FIGS. 7 and 8, and 331, 333, 335 of FIGS. 20 and 21) to form masks that are aligned during first and second etching steps. After this single etch has occurred, intermediate polysilicon is formed in each of the spaces between floating gates in the x-direction, this intermediate polysilicon becoming part of the steering gates in alternate spaces after some additional processing is performed and becoming gates for the select transistors as part of later completed word lines. The reference numbers used in FIGS. 23–26 for elements that correspond to those of FIGS. 3–9 are the same as those of FIGS. 3–9 with 400 added. For example, the semiconductor substrate in FIGS. 23–26 is labeled "445" while the substrate in FIGS. 3–9 is labeled "45". Although FIGS. 23–26 show only a part of the memory array, peripheral circuit elements may also be included and separated from the array by an oxide filled trench in the substrate, as described for each of the first two specific examples.

Referring to FIGS. 23A and 23B, the results of several processing steps are shown. A thin layer 503 of gate dielectric is formed on the surface 501 of the substrate 445, preferably by growing oxide to a thickness of about 90 Angstroms. A first layer 515 of polysilicon (P1) is deposited to a thickness of about 1000 Angstroms on the dielectric 503, either doped or undoped followed by an ion-implantation step. This polysilicon is then etched through an appropriate photoresist mask (not shown) into strips 511, 513 and 515 that are elongated in the x-direction and equally spaced apart in the y-direction across the substrate. A thick layer of oxide is then deposited over the entire array to fill the spaces between the polysilicon strips and cover them. The oxide on top of the polysilicon strips is then removed by etching or CMP to provide a substantially smooth surface, much like such the surface 129 of FIG. 6B.

After obtaining such a surface, an interpoly layer 401 of dielectric, such as ONO, is formed over that surface. A second layer 402 of polysilicon is then deposited over the dielectric layer 401, followed by a layer 403 of oxide being deposited over the polysilicon 402, and a layer 404 of silicon nitride being deposited over the oxide 403.

The resulting stack of layers shown in FIGS. 23A and 23B is then etched through another photoresist mask (not shown) to separate the first polysilicon (P1) strips into individual floating gates and separate the stack of layers 401–404 into strips a, b, c and d that are elongated in the y-direction but spaced apart in the x-direction. The width of the strips and spaces between them will generally be chosen to have the minimum feature size that is possible with the process that is used to make the circuit structure. The dielectric between the P1 strips is etched as well.

Next, a thin dielectric layer 406 is formed on the sidewalls of the separated strips and the exposed substrate surface, preferably being ONO formed in the same manner as the layers 351 and 351 of the previous example. Spacers 407 are then formed on the vertical surfaces by depositing a thick layer of oxide over the structure and then anisotropically etching the oxide away to leave the spacers. Source and drain regions 449 and 451 are made by implanting ions into the substrate through every other space between the stacks, the remaining spaces being covered by an appropriate mask (not shown). It is preferable to perform the implantation after the spacers 407 are formed, in order to obtain very narrow implants in the x-direction, but it can be done earlier. Since the spaces between the stacks are continuous across a large extent of the array, continuous source and drain implants are formed that extend in the y-direction across a large number of rows of memory cells.

A next step is to deposit a third layer of polysilicon over the entire area in order to provide polysilicon in each of the spaces between the spacers 407. This polysilicon is then removed by etching to leave strips 410, 411 and 412 (IP) elongated in the y-direction and with top surfaces that lie above the P2 polysilicon layer 402 and below the nitride layer 404. From every other of the intermediate polysilicon strips across the structure in the x-direction, including the element 411, is formed a select transistor gate as part of a word line that is later formed. The other intermediate polysilicon elements, such as the elements 410 and 412, later become part of the steering gates.

The results of several more processing steps are shown in FIGS. 25A and 25B. Channels are formed in the oxide and nitride layers 403 and 404 having a depth down to the P2 polysilicon layer 402. These channels are continuous in the y-direction and spaced apart in the x-direction over every other of the intermediate polysilicon (IP) strips. Such channels are shown in FIG. 25A to have been made over the intermediate polysilicon strips 410 and 412, while avoiding the region around the intermediate polysilicon strip 411. These channels are preferably formed by etching through a photoresist mask (not shown) on top of the nitride layer 404. The channels are indicated in FIG. 25A to be the areas occupied by P2' polysilicon strips 415 and 416, and respective covering oxide layers 417 and 418.

After the channels are formed, another layer of polysilicon is deposited over the surface in order to fill these channels. The intermediate spaces, such as that occupied by the intermediate polysilicon strip 411, are covered by an appropriate mask (not shown) during this deposition. The top of this polysilicon layer is removed down to the top of the nitride layer 404 by etching or CMP. That leaves the formed channels filled with polysilicon strips. This polysilicon is then oxidized in order to form protective dielectric layers 417 and 418 on top of the polysilicon strips. Exposed intermediate polysilicon surfaces, such as that of the polysilicon strip 411, are preferably covered by another temporary mask during this oxidation step in order to avoid them becoming oxidized.

It will be noted from FIG. 25A that the P2' strip 415 is in contact with the P2 polysilicon strips 402a and 402b as well as the intermediate polysilicon strip 410. These elements are each electrically conductive and connected together, both physically and electrically. This combination, identified in FIG. 26A by the reference number 421, provides a steering gate elongated in the y-direction and having capacitive coupling with two adjacent columns of floating gates, including floating gates 455 and 456. A similar composite steering gate 422 is shown.

The word lines 492–495 are then formed by depositing another layer of polysilicon over the array and etching it to leave the word lines in place. As part of this etching step, the strips of intermediate polysilicon within the alternate spaces between floating gates, such as the strip 411, are also separated to leave individual select transistor gates located under and in mechanical and electrical contact with their respective word lines. Thus, the separated intermediate polysilicon gate elements and the word lines together form strips such as the strip 492 shown in FIG. 26A.

Alternate Storage Elements

The foregoing invention summary and specific examples of flash EEPROM memory cells have been described with respect to the type of cell that utilizes conductive floating gates as charge storage elements. However, many of the cell structures and processes described above also apply to memory cells that use a charge trapping dielectric as the storage element in place of a floating gate. When the floating gates are replaced by such a dielectric, the dielectric is then sandwiched between the control or steering gates and the substrate. Although the dielectric can be separated into individual elements with the same sizes and positions as the floating gates, it is usually not necessary to do so since charge is trapped locally by such a dielectric. The charge trapping dielectric can extend over the entire array except in areas occupied by the select transistors. One specific configuration is for the dielectric to be formed in strips extending continuously in the y-direction across a large number of rows of cells but individually have a width that is contained between adjacent select transistors in the x-direction. Other regions of the dielectric may be removed in the course of separating the polysilicon layer(s) above the dielectric into its elongated strips without adverse effects but it is not necessity to do so. A portion of the dielectric within each cell that is sandwiched between a conductive gate and the substrate within the cell's channel is then a charge storage element for that cell.

Dielectric storage element memory cells are generally described in the following technical articles and patent, which articles and patent are incorporated herein in their entirety by this reference: Chan et al., "A True Single-Transistor Oxide-Nitride-Oxide EEPROM Device," *IEEE Electron Device Letters,* Vol. EDL-8, No. 3, March 1987, pp. 93–95; Nozaki et al., "A 1-Mb EEPROM with MONOS Memory Cell for Semiconductor Disk Application," *IEEE Journal of Solid State Circuits,* Vol. 26, No. 4, April 1991, pp. 497–501; Eitan et al., "NROM: A Novel Localized Trapping, 2-Bit Nonvolatile Memory Cell," *IEEE Electron Device Letters,* Vol. 21, No. 11, November 2000, pp. 543–545, and U.S. Pat. No. 5,851,881.

There are three specific charge trapping dielectric materials and configurations that can be utilized. One is a two-layer dielectric with oxide grown on the substrate and a layer of silicon nitride deposited thereover ("ON"). Another is a three-layer structure that adds another layer of silicon oxide, grown and/or deposited, over the silicon nitride layer ("ONO"). A third alternative is a single layer of silicon rich silicon dioxide sandwiched between the gate and the semiconductor substrate surface. This later material is described in the following two articles, which articles are incorporated herein in their entirety by this reference: DiMaria et al., "Electrically-alterable read-only-memory using Si-rich $SiO_2$ injectors and a floating polycrystalline silicon storage layer," *J. Appl. Phys.* 52(7), July 1981, pp. 4825–4842; Hori et al., "A MOSFET with Si-implanted Gate-$SiO_2$ Insulator for Nonvolatile Memory Applications," IEDM 92, April 1992, pp. 469–472.

Conclusion

Although the various aspects of the present invention have been described with respect to specific examples thereof, it will be understood that the invention is entitled to protection within the full scope of the appended claims.

What is claimed is:

1. A method of forming a non-volatile memory integrated circuit, comprising:

growing a layer of dielectric across a surface of the substrate, depositing a layer of conductive material across the dielectric layer, removing a portion of the conductive material layer to form a plurality of slots, which leave conductive material layer strips, elongated in a first direction and spaced apart in a second direction, the first and second directions being orthogonal to each other, thereafter depositing field dielectric over and extending into the plurality of slots between the conductive material layers strips, separating the first conductive material layer strips into individual floating gates, thereby forming an array of rows and columns of the floating gates that are individually separated from the substrate surface by the grown layer of dielectric sandwiched therebetween, forming conductive ion strips in the substrate surface that are elongated in the second direction continuously across a plurality of rows of floating gates and regularly spaced apart in the first direction in between columns of floating gates; and forming trenches elongated in the first direction across a plurality of ion implant regions and spaced apart in the second direction with positions in between the rows of floating gates, and filing the trenches with a dielectric material, the trenches being shallow enough so as not to interrupt the conductivity of the substrate ion strips along their lengths.

2. The method of claim 1, additionally comprising providing peripheral circuits adjacent the array of floating gates, forming at least one trench between the array and the peripheral circuits and filing said at least one trench with a dielectric material, thereby to electrically isolate the array and peripheral circuits, said at least one trench being significantly deeper than the trenches between the rows of floating gates.

3. The method of claim 1, additionally comprising providing peripheral circuits adjacent the array of floating gates, forming at least one trench between the array and the peripheral circuits and filing said at least one trench with a dielectric material, thereby to electrically isolate the array and peripheral circuits.

4. The method of claim 1, wherein depositing the conductive layer includes depositing polysilicon material.

5. A method of forming a non-volatile memory array on a substrate, comprising:

growing a layer of dielectric across a surface of the substrate, depositing a first layer of polysilicon across the dielectric layer, removing a portion of the first polysilicon layer to form a first plurality of slots, which leave first polysilicon layer strips, elongated in a first direction and spaced apart in a second direction, the first and second directions being orthogonal to each other, thereafter depositing field dielectric over and extending into the first plurality of slots between the first polysilicon layer strips, removing a top portion of the field dielectric to form a uniform surface across the first polysilicon layer strips, thereby leaving field dielectric between the first polysilicon layer strips in the second direction, thereafter removing a portion of the first polysilicon layer strips and field dielectric in a pattern forming a second plurality of slots continuously elongated in the second direction across a plurality of the first polysilicon layer strips and regularly spaced apart in the first direction, thereby separating the first polysilicon layer strips into segments between the second plurality of slots that have equal lengths in the first direction, implanting ions into the substrate through the second plurality of slots while the remaining first polysilicon layer strip segments and field oxide act as a mask to block ions from reaching the substrate outside of the second plurality of slots, thereby forming continuous ion strips implanted into the substrate and elongated in the second direction across a plurality of the first polysilicon layer strips, thereafter forming, from a second layer of polysilicon deposited over said uniform surface and into the second plurality of slots, steering gates elongated in the second direction and spaced apart in the first direction, separating the individual first polysilicon layer strip segments into two floating gates by removing a portion of the first polysilicon layer strip segments exposed between adjacent steering gates, thereby to form spaces between adjacent floating gates, and thereafter forming, from a third layer of polysilicon deposited over the steering gates and into the spaces between adjacent floating gates, word lines spaced apart in the second direction and elongated across individual rows of floating gates in the fist direction.

6. The method of claim 5, wherein the step of forming steering gates includes using an etch mask over the deposited second polysilicon layer without self-alignment with the second plurality of slots of the fist polysilicon layer.

7. The method of claim 5, wherein the step of forming steering gates includes orienting the steering gates with spaces between them being self-aligned in the first direction intermediate of adjacent ones of the second plurality of slots in the first polysilicon layer.

8. The method of claim 5, wherein removing the first polysilicon layer strips and field oxide in a pattern forming a second plurality of slots includes:

forming first elements of a dielectric mask with lengths oriented in the second direction across the first polysilicon layer strips and field oxide in between and being regularly spaced apart in the first direction, and forming dielectric spacers as second elements of the dielectric mask along both sides of the first elements, reducing the width of said second plurality of slots through which the ions are implanted.

9. The method of claim 8, wherein forming the steering gates includes:

after implanting the ions into the substrate, removing the spaces of the dielectric mask while leaving the mask first elements in place, depositing the second layer of polysilicon over and between the mask first elements, removing any portion of the second layer of polysilicon that is above the mask first elements, and thereafter removing the mask first elements, whereby spaces between the steering gates in the first direction are formed.

10. The method of claim 9, wherein separating the individual first polysilicon layer strip segments includes etching the first polysilicon layer strip segments through the spaces between the steering gates.

11. The method or claim 10, wherein forming word lines includes depositing the third layer of polysilicon into the spaces between adjacent floating gates through the spaces between the steering gates.

12. The method of claim 5, wherein removing the top portion of the field dielectric includes using chemical-mechanical-planarization (CMP).

13. The method of claim 5, which additionally comprises, after separating the individual first polysilicon layer strip segments into two floating gates, depositing a dielectric material into the spaces formed between adjacent floating gates in a manner to fill a portion of those spaces, the subsequent step of forming word lines including depositing the third layer of polysilicon into the spaces over the deposited dielectric material.

14. The method of claim 5, which additionally comprises, after separating the individual first polysilicon layer strip segments into two floating gates, forming recesses in the substrate that are aligned with the spaces between adjacent floating gates, and wherein the subsequent step of forming word lines includes depositing the third layer of polysilicon though the spaces between adjacent floating gates and into the substrate recesses.

15. The method of claim 14, wherein separating the first polysilicon layer strip segments into two floating gates additionally includes forming spacers on side walls of the adjacent steering gates in order to reduce the extent of the first polysilicon layer strip segments that are exposed between adjacent steering gates.

16. The method of claim 5, which additionally comprises, prior to forming the steering gates, reducing a thickness of the field dielectric between the first polysilicon layer strips to a level below a top surface and a top portion of the sides of the first polysilicon layer strips, and wherein the subsequent formation of the steering gates includes wrapping the steering gates around the top surface and side portion of the sides of the first polysilicon layer strips.

17. The method of claim 5, which additionally comprises, prior to implanting ions into the substrate through the second plurality of slots, narrowing a width of the second plurality of slots in the first direction by forming spacers along sides of the second plurality of slots, thereby to subsequently implant ions through the second plurality of slots after being narrowed.

18. The method of claim 17, which additionally comprises, after implanting ions into the substrate through the narrowed second plurality of slots, removing the spacers.

19. The method of claim 5, which additionally comprises, prior to forming the second plurality of slots, depositing a further layer of polysilicon over the uniform surface and separating the further layer into further strips positioned on top of the first polysilicon layer strips, the further strips being elongated in a first direction and spaced apart in the second direction by a distance that is less than the distance between the first polysilicon layer strips in the second direction, the further strips becoming part of the first polysilicon strips during subsequent processing that forms the second plurality of slots and separates the first polysilicon layer strip segments.

20. A method of forming a non-volatile memory array on a substrate, comprising:

growing a layer of dielectric across a surface of the substrate, depositing a first layer of polysilicon across the dielectric layer, removing a portion of the first polysilicon layer to form a first plurality of slots, which leave first polysilicon layer strips, elongated in a first direction and spaced apart in a second direction, the first and second directions being orthogonal to each other, thereafter depositing field dielectric over and extending into the first plurality of slots between the first polysilicon layer strips, removing a top portion of the field dielectric to form a uniform surface across the first polysilicon layer strips, thereby leaving field dielectric between the first polysilicon layer strips in the second direction, thereafter removing a portion of the first polysilicon layer strips and field dielectric in a pattern forming a second plurality of slots continuously elongated in the second direction across a plurality of the first polysilicon layer strips and regularly spaced apart in the first direction, thereby separating the first polysilicon layer strips into individual floating gates, implanting ions into the substrate through alternate ones of the second plurality of slots, thereby forming continuous ion strips implanted into the substrate and elongated in the second direction across a plurality of rows of floating gates, thereafter forming polysilicon elements within the individual second plurality of slots at least between adjacent floating gates, forming, from another layer of polysilicon deposited over said uniform surface and in contact with the polysilicon elements within said alternate ones of the second plurality of slots, steering gates elongated in the second direction and spaced apart in the first direction, and forming, from a further layer of polysilicon deposited over the steering gates and in contact with the polysilicon elements within others of the second plurality of slots than said alternate ones, word lines spaced apart in the second direction and elongated across individual rows of floating gates in the first direction.

* * * * *